US009824700B1

(12) United States Patent
Aritomo et al.

(10) Patent No.: US 9,824,700 B1
(45) Date of Patent: Nov. 21, 2017

(54) MANUFACTURING METHOD FOR A MAGNETIC HEAD INCLUDING A MAIN POLE AND A WRITE SHIELD

(71) Applicant: TDK CORPORATION, Tokyo (JP)

(72) Inventors: Hiroki Aritomo, Tokyo (JP); Atsushi Yamaguchi, Tokyo (JP); Michitaka Nishiyama, Tokyo (JP); Yumiko Yokoyama, Tokyo (JP); Koichi Otani, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/161,999

(22) Filed: May 23, 2016

(51) Int. Cl.
H01L 21/302 (2006.01)
H01L 21/461 (2006.01)
H01G 4/00 (2006.01)
H01G 5/00 (2006.01)
H01G 7/00 (2006.01)
H01G 9/00 (2006.01)
H01G 13/00 (2013.01)
H01B 13/00 (2006.01)
B44C 1/22 (2006.01)
C03C 15/00 (2006.01)
C03C 25/68 (2006.01)
C23F 1/00 (2006.01)
G11B 5/127 (2006.01)
G11B 5/11 (2006.01)
G11B 5/39 (2006.01)
H01L 21/027 (2006.01)
H01L 45/00 (2006.01)

(52) U.S. Cl.
CPC ............ *G11B 5/1272* (2013.01); *G11B 5/112* (2013.01); *G11B 5/1278* (2013.01); *G11B 5/3912* (2013.01); *H01L 21/027* (2013.01); *H01L 45/1675* (2013.01); *H01L 45/1683* (2013.01); *H01L 45/1691* (2013.01)

(58) Field of Classification Search
None
See application file for complete search history.

(56) References Cited

U.S. PATENT DOCUMENTS

| 8,289,649 | B2 | 10/2012 | Sasaki et al. | |
|---|---|---|---|---|
| 8,427,781 | B1 | 4/2013 | Sasaki et al. | |
| 8,472,137 | B2 | 6/2013 | Hirata et al. | |
| 2012/0140358 | A1* | 6/2012 | Sasaki | G11B 5/1278 360/122 |
| 2012/0206629 | A1* | 8/2012 | Nakamura | H04N 5/357 348/241 |
| 2015/0380016 | A1* | 12/2015 | Sasaki | G11B 5/3163 360/119.02 |

* cited by examiner

Primary Examiner — Stephanie Duclair
(74) Attorney, Agent, or Firm — Oliff PLC

(57) ABSTRACT

A manufacturing method for a magnetic head forms a leading shield having a top surface. The top surface of the leading shield includes first and second portions. The second portion is located farther from a medium facing surface than is the first portion, and recessed from the first portion. A first gap layer is then formed on the first portion. Then, a magnetic layer including an initial first side shield, an initial second side shield and a coupling section connecting them is formed using a mold. The mold is then removed. The coupling section is then removed by etching the magnetic layer. A second gap layer and a main pole are then formed in this order.

5 Claims, 23 Drawing Sheets

MANUFACTURING METHOD FOR A MAGNETIC HEAD INCLUDING A MAIN POLE AND A WRITE SHIELD

BACKGROUND OF THE INVENTION

1. Field of the Invention

The present invention relates to a manufacturing method for a magnetic head including a main pole and a write shield.

2. Description of Related Art

The recording systems of magnetic recording devices such as magnetic disk drives include a longitudinal magnetic recording system in which the magnetization of signals is directed along the plane of a recording medium (the longitudinal direction), and a perpendicular magnetic recording system in which the magnetization of signals is directed perpendicular to the plane of a recording medium. It is known that the perpendicular magnetic recording system is harder to be affected by thermal fluctuation of the recording medium and capable of providing higher linear recording density, compared with the longitudinal magnetic recording system.

Magnetic heads for perpendicular magnetic recording typically have, like those for longitudinal magnetic recording, a structure in which a read head unit having a magnetoresistance element (hereinafter, also referred to as MR element) for reading and a write head unit having an induction-type electromagnetic transducer for writing are stacked on the top surface of a substrate.

A magnetic head for use in a magnetic disk drive is typically incorporated in a slider. The slider has a medium facing surface configured to face a recording medium. The medium facing surface has an air inflow end (a leading end) and an air outflow end (a trailing end). The slider is configured to slightly fly over the surface of the recording medium by means of an airflow that comes from the leading end into the space between the medium facing surface and the recording medium. The recording medium includes a magnetic recording layer. Tracks are concentrically formed in the magnetic recording layer. The tracks are the area of the magnetic recording layer on which data is to be written.

The write head unit includes a main pole. The main pole has an end face located in the medium facing surface, and produces, from the end face, a write magnetic field in a direction perpendicular to the plane of the recording medium.

Here, the side of the positions closer to the leading end relative to a reference position will be referred to as the leading side, and the side of the positions closer to the trailing end relative to the reference position will be referred to as the trailing side. The leading side is the rear side in the direction of travel of the recording medium relative to the slider. The trailing side is the front side in the direction of travel of the recording medium relative to the slider.

The magnetic head is typically disposed near the trailing end of the medium facing surface of the slider. In a magnetic disk drive, positioning of the magnetic head is performed by a rotary actuator, for example. In this case, the magnetic head moves over the recording medium along a circular orbit about the center of rotation of the rotary actuator. In such a magnetic disk drive, a tilt of the magnetic head with respect to the tangent of the circular track, which is called a skew, occurs depending on the position of the magnetic head across the tracks.

Particularly, in a magnetic disk drive of the perpendicular magnetic recording system which is higher in capability of writing on a recording medium than the longitudinal magnetic recording system, there may occur the phenomenon that signals already written on one or more tracks in the neighborhood of a track targeted for writing are erased or attenuated during writing of a signal on the track targeted for writing. In the present application, this phenomenon will be called unwanted erasure. Unwanted erasure includes adjacent track erasure (ATE) and wide-area track erasure (WATE). Unwanted erasure is noticeably encountered upon occurrence of a skew. For enhancement of recording density, it is necessary to prevent unwanted erasure.

A known technique for preventing unwanted erasure and enhancing the recording density is to provide a wrap-around shield and a gap section, the wrap-around shield being a write shield having an end face that is located in the medium facing surface and surrounds the end face of the main pole, the gap section separating the wrap-around shield from the main pole. This technique is disclosed in, for example, U.S. Pat. Nos. 8,472,137 B2, 8,427,781 B1 and 8,289,649 B2.

The wrap-around shield includes a leading shield, first and second side shields, and a trailing shield. The leading shield has an end face located in the medium facing surface at a position on the leading side of the end face of the main pole. The first and second side shields have two end faces located in the medium facing surface at positions on opposite sides of the end face of the main pole in the track width direction. The trailing shield has an end face located in the medium facing surface at a position on the trailing side of the end face of the main pole.

The gap section includes a leading gap section for separating the leading shield from the main pole, first and second side gap sections for separating the first and second side shields from the main pole, and a trailing gap section for separating the trailing shield from the main pole.

The wrap-around shield has the function of capturing a magnetic flux that is produced from the end face of the main pole and spreads in directions other than the direction perpendicular to the plane of the recording medium, and thereby preventing the magnetic flux from reaching the recording medium. A magnetic head provided with the wrap-around shield is able to prevent unwanted erasure and provide further enhanced recording density.

The position of an end of a record bit to be recorded on the recording medium is determined by the position of the trailing-side edge (hereinafter referred to as the top edge) of the end face of the main pole in the medium facing surface. Accordingly, what are important for enhancing the write characteristics of the write head unit include: high write magnetic field strength at the top edge or in the vicinity thereof; and a large gradient of change in the write magnetic field strength at the top edge or in the vicinity thereof in the distribution of the write magnetic field strength in the direction in which the tracks extend. High write magnetic field strength at the top edge or in the vicinity thereof contributes to the enhancement of overwrite property. A large gradient of change in the write magnetic field strength at the top edge or in the vicinity thereof contributes to the reduction of bit error rate.

A magnetic head provided with the wrap-around shield suffers from the problem that when a large amount of magnetic flux leaks from the main pole to the wrap-around shield, particularly to the leading shield and the first and second side shields, there occurs reductions in the write magnetic field strength and the aforementioned gradient of change at the top edge of the end face of the main pole or in the vicinity of the top edge, and the write characteristics are thereby degraded.

Now, we will discuss a configuration in which the thickness of the leading gap section is constant regardless of distance from the medium facing surface. First, assume that the thickness of the leading gap section is small. In this case, the end face of the main pole and the end face of the leading shield are at a small distance from each other in the medium facing surface. Thus, the write shield can fully perform the function of capturing a magnetic flux that is produced from the end face of the main pole and spreads in directions other than the direction perpendicular to the plane of the recording medium. However, because of the small distance between the main pole and the leading shield, flux leakage from the main pole to the leading shield increases to degrade the write characteristics.

Next, assume that the thickness of the leading gap section is large. In this case, it is possible to reduce flux leakage from the main pole to the leading shield. However, because of a large distance between the end face of the main pole and the end face of the leading shield in the medium facing surface, the write shield cannot perform its function satisfactorily.

In the magnetic head disclosed in U.S. Pat. No. 8,427,781 B1, the main pole has a bottom end located at the leading-side edge. The bottom end includes a first inclined portion, a first flat portion, a second inclined portion, and a second flat portion arranged in this order, the first inclined portion being closest to the medium facing surface. In this magnetic head, the leading shield has a first inclined surface opposed to the first inclined portion, and a second inclined surface located farther from the medium facing surface than the first inclined surface. The distance between the second inclined surface and the second inclined portion is greater than the distance between the first inclined surface and the first inclined portion.

In the magnetic head disclosed in U.S. Pat. No. 8,427,781 B1, a step exists between the first inclined portion and the second inclined portion at the bottom end of the main pole. In this magnetic head, due to the existence of the step, the main pole is small in volume and magnetic flux is likely to leak out of the main pole. These factors result in degradation of the write characteristics of the magnetic head.

U.S. Pat. No. 8,289,649 B2 discloses a manufacturing method for a magnetic head as follows. According to the manufacturing method, a mold is formed on the top surface of the leading shield by photolithography. The mold includes first and second receiving sections for receiving the first and second side shields, and a midsection located between the first receiving section and the second receiving section. Then, the first and second side shields are formed by plating so as to be received in the first and second receiving sections. The mold is then removed. Then, a gap layer is formed. The gap layer includes a leading gap section and first and second side gap sections. Then, the main pole is formed.

This manufacturing method is likely to generate a gap between the midsection of the mold and the top surface of the leading shield. If the gap is generated, a magnetic material used for forming the first and second side shields gets into the gap in the process of forming the first and second side shields. This results in the formation of unwanted coupling section coupling the first and second side shields to each other. In such a case, disadvantageously, the main pole becomes smaller in volume and the write characteristics of the magnetic head are thus degraded.

OBJECT AND SUMMARY OF THE INVENTION

It is an object of the present invention to provide a manufacturing method for a magnetic head that can prevent the occurrence of unwanted erasure while suppressing degradation of write characteristics.

A magnetic head manufactured by a manufacturing method of the present invention includes: a medium facing surface configured to face a recording medium; a main pole for producing a write magnetic field for use to write data on the recording medium by means of a perpendicular magnetic recording system; a write shield formed of a magnetic material; and a gap section formed of a nonmagnetic material and separating the write shield from the main pole.

The main pole has: an end face located in the medium facing surface; a top surface located at a front-side end of the main pole in the direction of travel of the recording medium; and a bottom end opposite to the top surface. The write shield includes a leading shield located on the rear side in the direction of travel of the recording medium relative to the main pole, and a first side shield and a second side shield located on opposite sides of the main pole in the track width direction.

The leading shield has a leading shield end face located in the medium facing surface, and a top surface opposed to the bottom end of the main pole. The leading shield end face is located on the rear side in the direction of travel of the recording medium relative to the end face of the main pole. The top surface of the leading shield includes a first portion and a second portion. The first portion has an end located in the medium facing surface. The second portion is located farther from the medium facing surface than is the first portion, and recessed from the first portion. The gap section includes a first gap layer and a second gap layer. The first gap layer is interposed between the second portion and the second gap layer. The second gap layer has a front end located in the medium facing surface. The second gap layer separates the main pole from the leading shield, the first and second side shields and the first gap layer.

The manufacturing method for the magnetic head of the present invention includes the steps of: forming the leading shield; forming the first gap layer on the second portion of the top surface of the leading shield after the leading shield is formed; forming a mold after the first gap layer is formed, the mold including a first receiving section and a second receiving section for receiving the first side shield and the second side shield, the mold further including a midsection which is located between the first and second receiving sections and forms a gap between the first portion and the first gap layer; forming a magnetic layer, the magnetic layer including an initial first side shield received in the first receiving section, an initial second side shield received in the second receiving section, and a coupling section located in the gap and coupling the initial first side shield and the initial second side shield to each other; removing the mold after the magnetic layer is formed; removing the coupling section after the mold is removed, by etching the magnetic layer so that the initial first side shield becomes the first side shield and the initial second side shield becomes the second side shield; forming the second gap layer after the coupling section is removed; and forming the main pole after the second gap layer is formed.

In the manufacturing method for the magnetic head of the present invention, the step of forming the mold may include the steps of: forming a first resist layer in regions where the first initial side shield and the second initial side shield are to be located later; forming a separating film to cover the first resist layer; forming a second resist layer on the separating film, the second resist layer being intended to become the mold later; and removing the first resist layer and at least part of the separating film so that the second resist layer remains and becomes the mold.

In the manufacturing method for the magnetic head of the present invention, the step of forming the leading shield includes the steps of: forming an initial leading shield having a top surface, the top surface including a first region to become the first portion and a second region to be etched later to form the second portion; and etching the second region of the top surface of the initial leading shield so that the first region becomes the first portion and the second portion is formed by the etching of the second region to thereby make the initial leading shield into the leading shield.

In the manufacturing method for the magnetic head of the present invention, the top surface of the leading shield may have a first end located in the medium facing surface and a second end opposite to the first end. In this case, the top surface of the leading shield may be inclined with respect to the medium facing surface and a direction perpendicular to the medium facing surface such that the second end is located on the rear side in the direction of travel of the recording medium relative to the first end.

In the magnetic head manufactured by the manufacturing method of the present invention, the write shield may further include a trailing shield located on the front side in the direction of travel of the recording medium relative to the main pole. The gap section may further include a third gap layer for separating the trailing shield from the top surface of the main pole. In such a case, the manufacturing method for the magnetic head of the present invention further includes the steps of: forming the third gap layer after the main pole is formed; and forming the trailing shield after the third gap layer is formed.

The manufacturing method for the magnetic head of the present invention allows for a reduction in leakage of magnetic flux from the main pole to the leading shield by increasing the distance between the bottom end of the main pole and the top surface of the leading shield at a location apart from the medium facing surface, while allowing the end face of the main pole and the leading shield end face to be at a desired distance from each other in the medium facing surface. According to the manufacturing method, the coupling section is removed by etching the magnetic layer after the mold is removed. This makes it possible to prevent a volume reduction of the main pole and degradation of the write characteristics of the magnetic head attributable to the coupling section. Thus, the present invention allows for manufacture of a magnetic head that is capable of preventing the occurrence of unwanted erasure and is less prone to degradation of write characteristics.

Other objects, features and advantages of the present invention will become fully apparent from the following description.

DETAILED DESCRIPTION OF THE PREFERRED EMBODIMENT

Figure 4:
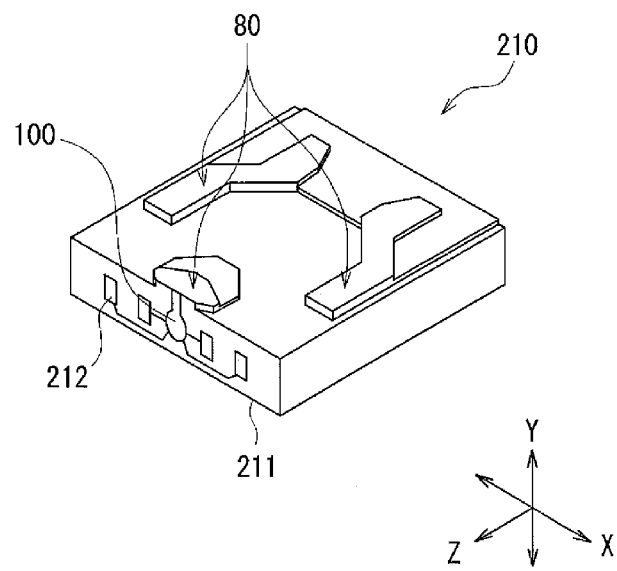
FIG. 4 is a perspective view showing a slider including the magnetic head according to the embodiment of the invention.

An embodiment of the present invention will now be described in detail with reference to the drawings. First, reference is made to FIG. 4 to describe a slider 210 including a magnetic head according to the embodiment of the invention. The magnetic head according to the embodiment is for use in perpendicular magnetic recording. In a magnetic recording device, the slider 210 is positioned to face a circular-plate-shaped recording medium (a magnetic disk) configured to be driven to rotate. In FIG. 4, the X direction is a direction across the tracks of the recording medium, i.e., the track width direction. The Y direction is a direction perpendicular to the surface of the recording medium. The Z direction is the direction of travel of the recording medium as viewed from the slider 210. The X, Y, and Z directions are orthogonal to one another. The slider 210 has a base body 211. The base body 211 is generally hexahedron-shaped. One of the six surfaces of the base body 211 is configured to face the surface of the recording medium. At this one of the six surfaces, there is formed a medium facing surface 80 to face the surface of the recording medium. When the recording medium rotates and travels in the Z direction, an airflow passing between the recording medium and the slider 210 causes a lift below the slider 210 in the Y direction in FIG. 4. The lift causes the slider 210 to fly over the surface of the recording medium. The magnetic head 100 according to the embodiment is formed near the air-outflow-side end (the end in the Z direction) of the slider 210. A plurality of terminals 212 are also provided at the air-outflow-side end of the slider 210.

A head assembly of the embodiment will now be described with reference to FIG. 5. The head assembly of the embodiment includes the slider 210 shown in FIG. 4 and a supporter for flexibly supporting the slider 210. Forms of the head assembly include a head gimbal assembly and a head arm assembly described below.

The head gimbal assembly 220 will be described first. The head gimbal assembly 220 includes the slider 210, and a suspension 221 serving as the supporter for flexibly supporting the slider 210. The suspension 221 includes: a plate-spring-shaped load beam 222 formed of, e.g., stainless steel; a flexure 223 to which the slider 210 is joined, the flexure 223 being provided at one end of the load beam 222 and giving an appropriate degree of freedom to the slider 210; and a base plate 224 provided at the other end of the load beam 222. The base plate 224 is configured to be attached to an arm 230 of an actuator for moving the slider 210 along the X direction across the tracks of the recording medium 262. The actuator has the arm 230 and a voice coil motor for driving the arm 230. A gimbal section for maintaining the orientation of the slider 210 is provided in the portion of the flexure 223 on which the slider 210 is mounted.

The head gimbal assembly 220 is attached to the arm 230 of the actuator. An assembly including the arm 230 and the head gimbal assembly 220 attached to the arm 230 is called a head arm assembly. An assembly including a carriage having a plurality of arms with a plurality of head gimbal assemblies 220 respectively attached to the arms is called a head stack assembly.

Figure 5:
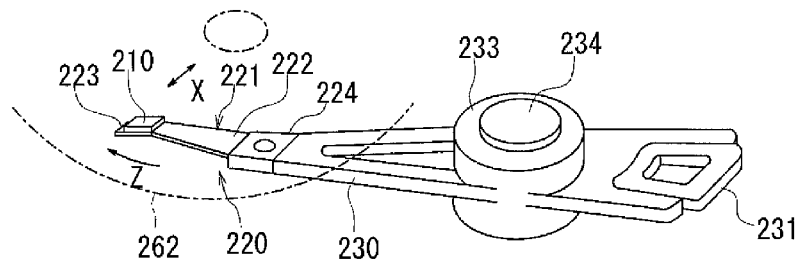
FIG. 5 is a perspective view showing a head arm assembly of the embodiment of the invention.

FIG. 5 shows the head arm assembly of the embodiment. In the head arm assembly, the head gimbal assembly 220 is attached to one end of the arm 230. A coil 231 constituting part of the voice coil motor is fixed to the other end of the arm 230. A bearing 233 is provided in the middle of the arm 230. The bearing 233 is attached to a shaft 234 for rotatably supporting the arm 230.

Figure 6:
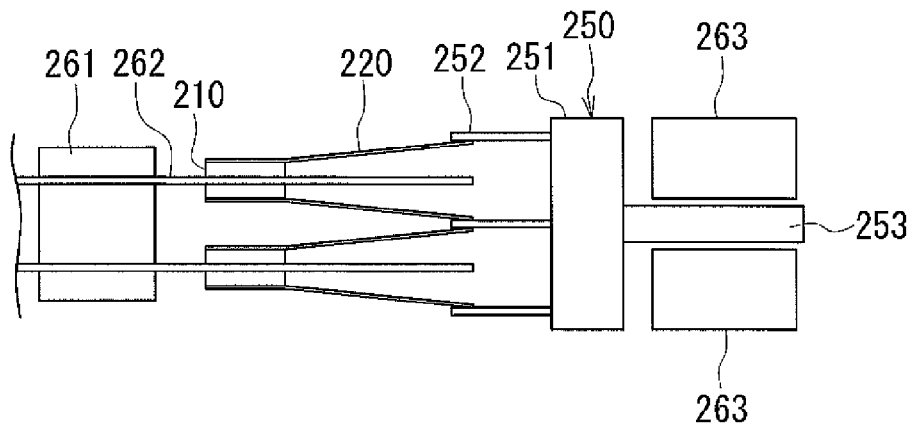
FIG. 6 is an explanatory diagram to illustrate the main part of a magnetic recording device of the embodiment of the invention.
Figure 7:
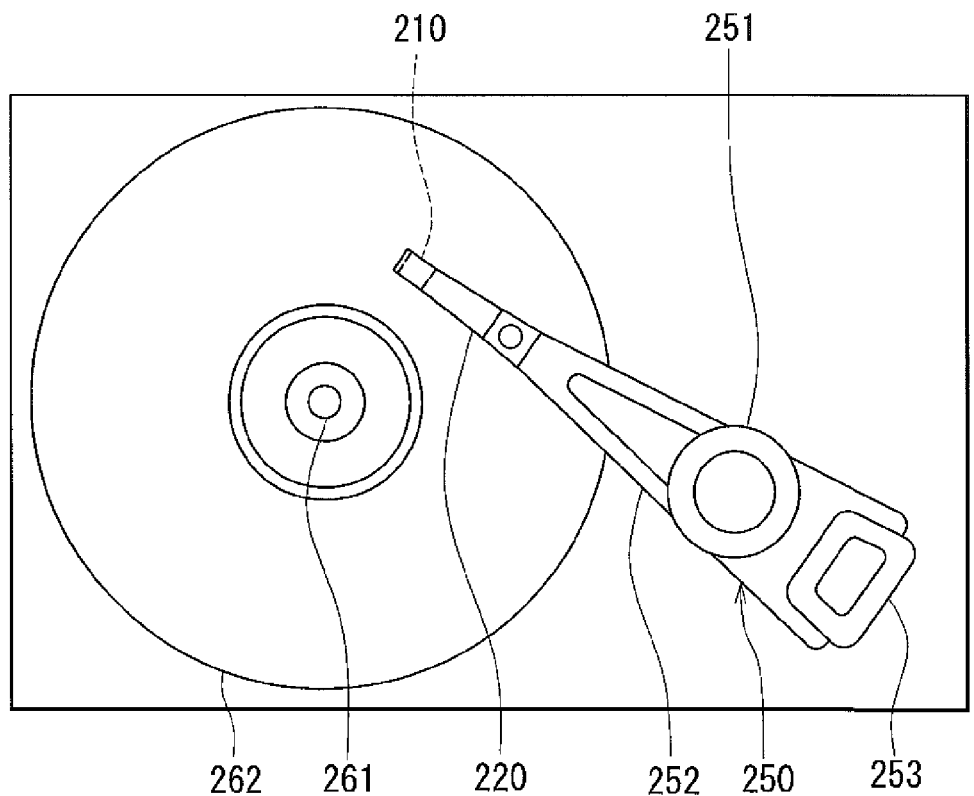
FIG. 7 is a plan view of the magnetic recording device of the embodiment of the invention.

Reference is now made to FIG. 6 and FIG. 7 to describe an example of the head stack assembly and an example of a magnetic recording device of the embodiment. FIG. 6 is an explanatory diagram illustrating the main part of the magnetic recording device. FIG. 7 is a plan view of the magnetic recording device. The head stack assembly 250 includes a carriage 251 having a plurality of arms 252. A plurality of head gimbal assemblies 220 are attached to the arms 252 such that the assemblies 220 are aligned in the vertical direction with spacing between every adjacent ones. A coil 253 constituting part of the voice coil motor is mounted on a side of the carriage 251 opposite from the arms 252. The head stack assembly 250 is installed in the magnetic recording device. The magnetic recording device includes a plurality of recording media 262 mounted on a spindle motor 261. Two sliders 210 are allocated to each recording medium 262 such that the two sliders 210 are opposed to each other with the recording medium 262 interposed therebetween. The voice coil motor includes permanent magnets 263 arranged to be opposed to each other with the coil 253 of the head stack assembly 250 interposed therebetween. The actuator and the head stack assembly 250 except the sliders 210 support the sliders 210 and position them with respect to the recording media 262.

In the magnetic recording device, the actuator moves the slider 210 across the tracks of the recording medium 262 and positions the slider 210 with respect to the recording medium 262. The magnetic head 100 included in the slider 210 is configured to write data on the recording medium 262 by using a write head unit and to read data stored on the recording medium 262 by using a read head unit.

Figure 2:
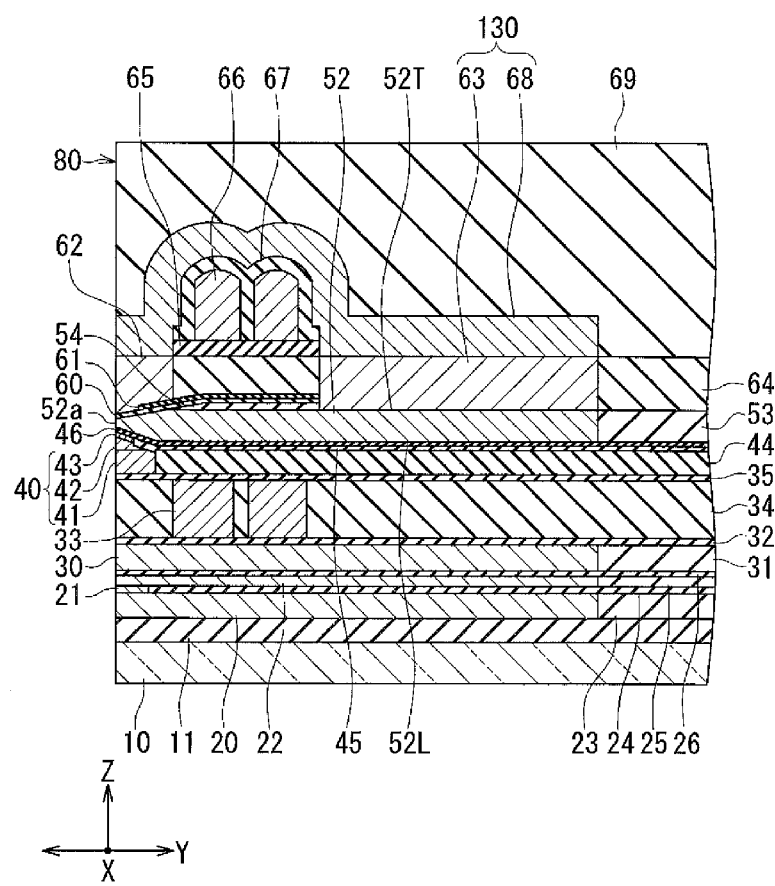
FIG. 2 is a cross-sectional view showing the configuration of the magnetic head according to the embodiment of the invention.
Figure 3:
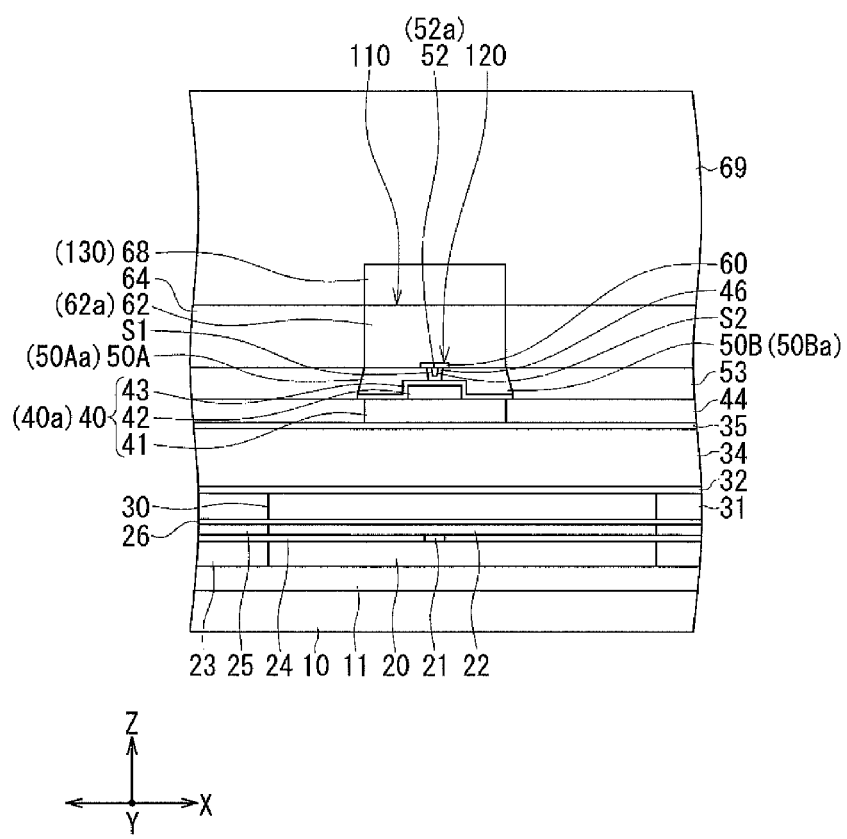
FIG. 3 is a front view showing the medium facing surface of the magnetic head according to the embodiment of the invention.

Reference is now made to FIG. 2 and FIG. 3 to describe the configuration of the magnetic head according to the embodiment. FIG. 2 is a cross-sectional view showing the configuration of the magnetic head. FIG. 3 is a front view showing the medium facing surface of the magnetic head. FIG. 2 shows a cross section perpendicular to the medium facing surface and to the top surface of the substrate. The X, Y, and Z directions shown in FIG. 4 are also shown in FIG. 2 and FIG. 3. In FIG. 2, the X direction is a direction orthogonal to the Y and Z directions. In FIG. 3, the Y direction is a direction orthogonal to the X and Z directions.

As shown in FIG. 2, the magnetic head according to the embodiment has the medium facing surface 80 configured to face the recording medium. As shown in FIG. 2 and FIG. 3, the magnetic head includes: a substrate 10 formed of a ceramic material such as aluminum oxide-titanium carbide ($Al_2O_3$—TiC); an underlying layer 11 formed of an insulating material such as alumina ($Al_2O_3$) and lying on the substrate 10; a bottom read shield layer 20 formed of a magnetic material and lying on the underlying layer 11; a magnetoresistance element (hereinafter referred to as MR element) 21 lying on the bottom read shield layer 20; and a top read shield layer 22 formed of a magnetic material and lying on the MR element 21.

An end of the MR element 21 is located in the medium facing surface 80. The MR element 21 may be a giant magnetoresistance (GMR) element or a tunneling magnetoresistance (TMR) element, for example. The GMR element may be of either the current-in-plane (CIP) type in which a sense current for use in magnetic signal detection is fed in a direction generally parallel to the plane of layers constituting the GMR element or the current-perpendicular-to-plane (CPP) type in which the sense current is fed in a direction generally perpendicular to the plane of layers constituting the GMR element. Where the MR element 21 is a TMR element or a CPP-type GMR element, the bottom read shield layer 20 and the top read shield layer 22 may also serve as electrodes for feeding the sense current to the MR element 21. Where the MR element 21 is a CIP-type GMR element, insulating films are respectively provided between the MR element 21 and the bottom read shield layer 20 and between the MR element 21 and the top read shield layer 22, and two leads are provided between these insulating films in order to feed the sense current to the MR element 21.

The magnetic head further includes: an insulating layer 23 formed of an insulating material and disposed around the bottom read shield layer 20; an insulating layer 24 formed of an insulating material, disposed between the bottom read shield layer 20 and the top read shield layer 22 and surrounding the MR element 21; and an insulating layer 25 formed of an insulating material and disposed around the top read shield layer 22. The insulating layers 23 to 25 are formed of alumina, for example. The parts from the bottom read shield layer 20 to the top read shield layer 22 constitute the read head unit.

The magnetic head further includes an insulating film 26 formed of an insulating material and lying on the top read shield layer 22 and the insulating layer 25, and the write head unit lying on the insulating film 26. The insulating film 26 is formed of alumina, for example.

The write head unit includes a coil 66 and a main pole 52. The coil 66 produces a magnetic field corresponding to data to be written on the recording medium. The main pole 52 has an end face 52a located in the medium facing surface 80. The main pole 52 passes a magnetic flux corresponding to the magnetic field produced by the coil 66, and produces a write magnetic field for use to write data on the recording medium by means of the perpendicular magnetic recording system. The coil 66 is formed of a conductive material such as copper.

As shown in FIG. 3, the write head unit further includes a write shield 110 formed of a magnetic material, and a gap section 120 formed of a nonmagnetic material. The write shield 110 includes a trailing shield 62, a leading shield 40, a first side shield 50A and a second side shield 50B. The trailing shield 62 is located on the trailing side, i.e., the front side in the direction of travel of the recording medium (the Z direction), relative to the main pole 52. The leading shield 40 is located on the leading side, i.e., the rear side in the direction of travel of the recording medium (the Z direction), relative to the main pole 52. The first and second side shields 50A and 50B are located on opposite sides of the main pole 52 in the track width direction (the X direction). The gap section 120 separates the write shield 110 from the main pole 52.

The write head unit further includes a middle shield layer 30 formed of a magnetic material and lying on the insulating film 26, and an insulating layer 31 formed of an insulating material and disposed around the middle shield layer 30. The insulating layer 31 is formed of alumina, for example. The top surfaces of the middle shield layer 30 and the insulating layer 31 are even with each other.

The write head unit further includes an insulating film 32 formed of an insulating material and lying on the middle shield layer 30 and the insulating layer 31, and a coil 33 formed of a conductive material and lying on the insulating film 32. The coil 33 is planar spiral-shaped. The write head unit further includes an insulating layer 34 formed of an insulating material and disposed around the coil 33 and in the space between adjacent turns of the coil 33. The insulating film 32 and the insulating layer 34 are formed of alumina, for example. The top surfaces of the coil 33 and the insulating layer 34 are even with each other.

The write head unit further includes an insulating film 35 formed of an insulating material and lying on the coil 33 and the insulating layer 34. The insulating film 35 is formed of alumina, for example.

The leading shield 40 includes a first layer 41 lying on the insulating film 35, a second layer 42 lying on the first layer 41, and a third layer 43 lying on the first layer 41 and the second layer 42. As shown in FIG. 3, the second layer 42 is smaller than the first layer 41 in width in the track width direction (the X direction).

The write head unit further includes an insulating layer 44 formed of an insulating material and surrounding the first layer 41 of the leading shield 40. The insulating layer 44 is formed of alumina, for example.

The first and second side shields 50A and 50B are located on the leading shield 40 and adjacent to each other in the track width direction (the X direction) with spacing therebetween. The first side shield 50A has a first sidewall opposed to a first side surface of the main pole 52 to be described later. The second side shield 50B has a second sidewall opposed to a second side surface of the main pole 52 to be described later.

As shown in FIG. 2, the gap section 120 includes a first gap layer 45 and a second gap layer 46 each formed of a nonmagnetic material. The first gap layer 45 lies on a part of the top surface of the leading shield 40 and a part of the top surface of the insulating layer 44. As shown in FIG. 2 and FIG. 3, the second gap layer 46 is provided to extend along the first and second sidewalls of the first and second side shields 50A and 50B, another part of the top surface of the leading shield 40, and the top surface of the first gap layer 45. The first gap layer 45 is formed of $SiO_2$, for example. The second gap layer 46 is formed of alumina, for example. The shape and locations of the first and second gap layers 45 and 46 will be described in more detail later.

The main pole 52 lies above the leading shield 40 and the insulating layer 44. The first and second gap layers 45 and 46 are interposed between the main pole 52 and each of the leading shield 40, the insulating layer 44 and the first and second side shields 50A and 50B.

The main pole 52 has a top surface 52T (see FIG. 2), a bottom end 52L (see FIG. 2), and a first side surface S1 and a second side surface S2 (see FIG. 3) in addition to the end face 52a mentioned previously. The top surface 52T is located at the trailing-side end of the main pole 52, i.e., the front-side end of the main pole 52 in the direction of travel of the recording medium (the Z direction). The bottom end 52L is opposite to the top surface 52T. The first and second side surfaces S1 and S2 are located at opposite ends of the main pole 52 in the track width direction (the X direction). The shape of the main pole 52 will be described in detail later.

The write head unit further includes a nonmagnetic layer 53 formed of a nonmagnetic material and disposed around the first and second side shields 50A and 50B and the main pole 52. The nonmagnetic layer 53 is formed of alumina, for example.

The write head unit further includes a nonmagnetic layer 54 formed of a nonmagnetic material and lying on a first portion of the top surface 52T of the main pole 52, the first portion being located away from the medium facing surface 80. The nonmagnetic layer 54 has a front end closest to the medium facing surface 80. The nonmagnetic layer 54 includes a wedge-shaped portion whose thickness decreases toward the medium facing surface 80. The wedge-shaped portion includes the aforementioned front end.

The nonmagnetic layer 54 is formed of an inorganic insulating material or a metal material, for example. Examples of inorganic insulating materials that can be used to form the nonmagnetic layer 54 include alumina and $SiO_2$. Examples of metal materials that can be used to form the nonmagnetic layer 54 include Ru and Ti.

The gap section 120 further includes a third gap layer 60 and a fourth gap layer 61 each formed of a nonmagnetic material. The third gap layer 60 lies on the nonmagnetic layer 54 and part of the main pole 52. The fourth gap layer 61 lies on the third gap layer 60 at a location away from the medium facing surface 80. The third and fourth gap layers 60 and 61 are formed of alumina, for example.

The write head unit further includes a return path section 130 formed of a magnetic material. The return path section 130 includes a first yoke layer 63 and a second yoke layer 68. The first yoke layer 63 lies on a second portion of the top surface 52T of the main pole 52, the second portion being located away from the medium facing surface 80. The second portion of the top surface 52T of the main pole 52 is located farther from the medium facing surface 80 than is the first portion of the top surface 52T of the main pole 52.

The trailing shield 62 lies on the first side shield 50A, the second side shield 50B, the third gap layer 60 and the fourth gap layer 61. The write head unit further includes an insulating layer 64 formed of an insulating material and disposed around the trailing shield 62 and the first yoke layer 63. The insulating layer 64 is formed of alumina, for example. The top surfaces of the trailing shield 62, the first yoke layer 63 and the insulating layer 64 are even with each other.

The write head unit further includes an insulating film 65 formed of an insulating material and lying on the insulating layer 64. The coil 66 lies on the insulating film 65. The write head unit further includes an insulating film 67 formed of an insulating material and disposed to cover the insulating film 65 and the coil 66. The insulating films 65 and 67 are formed of alumina, for example. The coil 66 is planar spiral-shaped.

The second yoke layer 68 lies on the trailing shield 62, the first yoke layer 63 and the insulating film 67, and connects the trailing shield 62 and the first yoke layer 63.

The magnetic head further includes a protective layer 69 formed of an insulating material such as alumina and disposed to cover the second yoke layer 68. The base body 211 shown in FIG. 4 is mainly constituted by the substrate 10 and the protective layer 69 shown in FIG. 2 and FIG. 3.

As has been described, the magnetic head according to the embodiment includes the medium facing surface 80, the read head unit, and the write head unit. The read head unit and the write head unit are stacked on the substrate 10. The read head unit is located on the leading side, i.e., the rear side in the direction of travel of the recording medium (the Z direction), relative to the write head unit.

The write head unit includes the coil 66, the main pole 52, the write shield 110, the gap section 120, and the return path section 130. The write shield 110 includes the trailing shield 62, the leading shield 40, and the first and second side shields 50A and 50B. The gap section 120 includes the first gap layer 45, the second gap layer 46, the third gap layer 60 and the fourth gap layer 61. The return path section 130 includes the first yoke layer 63 and the second yoke layer 68.

As shown in FIG. 2, the return path section 130 connects the trailing shield 62 and part of the main pole 52 located away from the medium facing surface 80 to each other so that a space is defined by the main pole 52, the third and fourth gap layers 60 and 61, the write shield 110 and the return path section 130. The coil 66 includes a portion passing through the aforementioned space.

The write shield 110 captures a disturbance magnetic field applied to the magnetic head from the outside thereof. This makes it possible to prevent the disturbance magnetic field from being intensively captured into the main pole 52 and thereby causing erroneous writing on the recording medium. The write shield 110 also has the function of capturing a magnetic flux that is produced from the end face 52a of the main pole 52 and spreads in directions other than a direction perpendicular to the plane of the recording medium, and thereby preventing the magnetic flux from reaching the recording medium. Furthermore, the write shield 110 and the return path section 130 have the function of allowing a magnetic flux that has been produced from the end face 52a of the main pole 52 and has magnetized a portion of the recording medium to flow back to the main pole 52.

The write head unit further includes the middle shield layer 30 and the coil 33. When a write current is supplied to the coils 33 and 66, magnetic fields are produced at the respective center portions of the coils 33 and 66 in mutually opposite directions. The coil 66 produces a magnetic field corresponding to data to be written on the recording medium. The coil 33 produces a magnetic field that prevents the magnetic field produced by the coil 66 from affecting the read head unit. The middle shield layer 30 has the function of shielding the read head unit from magnetic fields produced in the write head unit.

Figure 1:
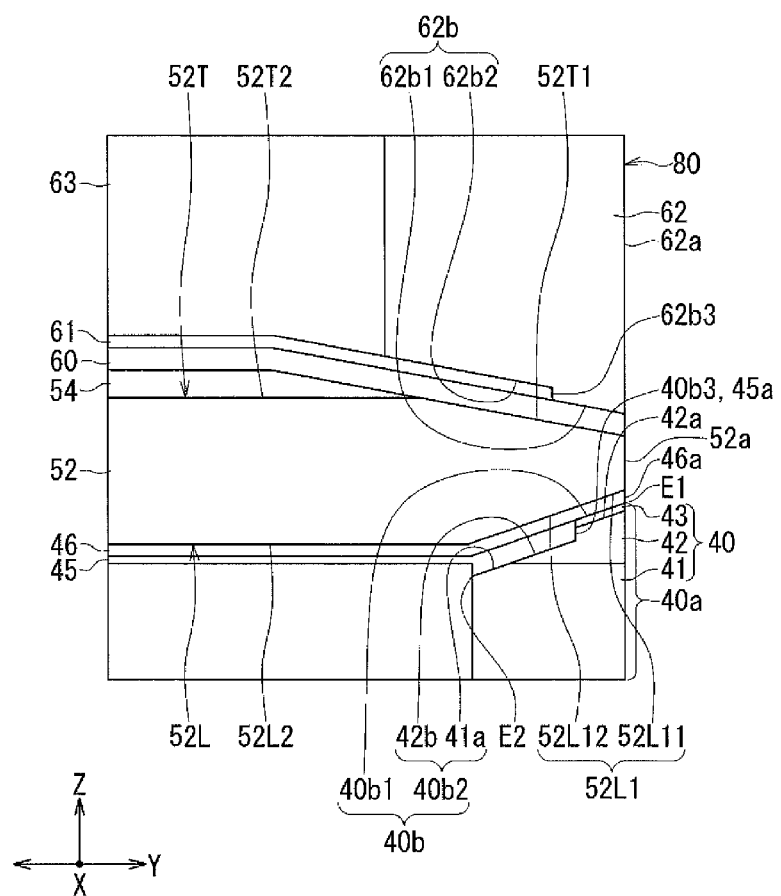
FIG. 1 is a cross-sectional view showing the main part of a magnetic head according to an embodiment of the invention.

The main pole 52, the write shield 110 and the gap section 120 will now be described in detail with reference to FIG. 1 to FIG. 3. FIG. 1 is a cross-sectional view showing the main part of the magnetic head. As shown in FIG. 1, the top surface 52T of the main pole 52 includes a first inclined portion 52T1 and a first flat portion 52T2, the first inclined portion 52T1 being closer to the medium facing surface 80 than the first flat portion 52T2. The first inclined portion 52T1 has a first end located in the medium facing surface 80 and a second end opposite thereto. The first flat portion 52T2 is connected to the second end. The first inclined portion 52T1 is inclined such that the second end is located on the trailing side, i.e., the front side in the direction of travel of the recording medium (the Z direction), relative to the first end. The first flat portion 52T2 extends in a direction substantially perpendicular to the medium facing surface 80.

As shown in FIG. 1, the bottom end 52L of the main pole 52 includes a second inclined portion 52L1 and a second flat portion 52L2, the second inclined portion 52L1 being closer to the medium facing surface 80 than the second flat portion 52L2. The second inclined portion 52L1 has a third end located in the medium facing surface 80 and a fourth end opposite thereto. The second inclined portion 52L1 may be an edge formed by two intersecting planes, or may be a plane connecting two planes to each other. The second flat portion 52L2 is a plane connected to the fourth end of the second inclined portion 52L1. The second inclined portion 52L1 is inclined such that the fourth end is located on the leading side, i.e., the rear side in the direction of travel of the recording medium (the Z direction), relative to the third end. The second flat portion 52L2 extends in a direction substantially perpendicular to the medium facing surface 80.

As shown in FIG. 3, the end face 52a of the main pole 52 has a top edge located at an end of the top surface 52T of the main pole 52, a first side edge located at an end of the first side surface S1 of the main pole 52, and a second side edge located at an end of the second side surface S2 of the main pole 52. The length of the top edge defines the track width. The position of an end of a record bit to be recorded on the recording medium is determined by the position of the top edge. The distance between the first side edge and the second side edge in the track width direction (the X direction) decreases with increasing distance from the top edge. In the example shown in FIG. 3, the end face 52a of the main pole 52 further has a bottom edge located at an end of the bottom end 52L of the main pole 52.

Although not illustrated, the main pole 52 may include a width-changing portion. In the width-changing portion, the width of the top surface 52T in the track width direction (the X direction) increases with increasing distance from the medium facing surface 80. The main pole 52 may further include a constant width portion located between the medium facing surface 80 and the width-changing portion. In the constant width portion, the width of the top surface 52T in the track width direction (the X direction) is substantially constant regardless of distance from the medium facing surface 80.

As shown in FIG. 1 and FIG. 3, the trailing shield 62 of the write shield 110 has a trailing shield end face 62a located in the medium facing surface 80, and a bottom surface 62b opposed to the top surface 52T of the main pole 52. The trailing shield end face 62a is located on the trailing side, i.e., the front side in the direction of travel of the recording medium (the Z direction), relative to the end face 52a of the main pole 52. The leading shield 40 of the write shield 110 has a leading shield end face 40a located in the medium facing surface 80, and a top surface 40b opposed to the bottom end 52L of the main pole 52. The leading shield end face 40a is located on the leading side, i.e., the rear side in the direction of travel of the recording medium, relative to the end face 52a of the main pole 52. As shown in FIG. 3, the first side shield 50A and the second side shield 50B of the write shield 110 respectively have a first side shield end face 50Aa and a second side shield end face 50Ba located on opposite sides of the end face 52a of the main pole 52 in the track width direction (the X direction) in the medium facing surface 80.

As shown in FIG. 1, the top surface 40b of the leading shield 40 includes a first portion 40b1 and a second portion 40b2. The first portion 40b1 has an end located in the medium facing surface 80. This end of the first portion 40b1 will be referred to as the first end and denoted by symbol E1. The second portion 40b2 is located farther from the medium facing surface 80 than is the first portion 40b1, and recessed from the first portion 40b1. There is formed a step 40b3 between the first portion 40b1 and the second portion 40b2.

The second inclined portion 52L1 of the bottom end 52L of the main pole 52 includes a third portion 52L11 opposed to the first portion 40b1, and a fourth portion 52L12 opposed to the second portion 40b2. As shown in FIG. 1, there is no step between the third portion 52L11 and the fourth portion 52L12.

As shown in FIG. 1, the top surface 40b of the leading shield 40 has the first end E1 mentioned above, and a second end E2 opposite to the first end E1. The top surface 40b of the leading shield 40 is inclined with respect to the medium facing surface 80 and the direction perpendicular to the medium facing surface 80 such that the second end E2 is located on the rear side in the direction of travel of the recording medium relative to the first end E1.

The first layer 41 of the leading shield 40 has a front end face located in the medium facing surface 80, a rear end face opposite to the front end face, a top surface, and an inclined surface 41a connecting the rear end face and the top surface. The second layer 42 of the leading shield 40 has a front end face located in the medium facing surface 80, and a top surface. The top surface of the second layer 42 includes a first inclined portion 42a and a second inclined portion 42b. The first inclined portion 42a has an end located in the medium facing surface 80. The second inclined portion 42b is located farther from the medium facing surface 80 than is the first inclined portion 42a, and recessed from the first inclined portion 42a. The inclined surface 41a of the first layer 41 is contiguous with the second inclined portion 42b. Part of the third layer 43 of the leading shield 40 extends along the first inclined portion 42a. The third layer 43 has a front end face located in the medium facing surface 80, and a top surface. The leading shield end face 40a is formed by the respective front end faces of the first layer 41, the second layer 42 and the third layer 43. The first portion 40b1 of the top surface 40b of the leading shield 40 is formed by the top surface of the third layer 43. The second portion 40b2 of the top surface 40b of the leading shield 40 is formed by the inclined surface 41a of the first layer 41 and the second inclined portion 42b of the top surface of the second layer 42.

As shown in FIG. 1, the bottom surface 62b of the trailing shield 62 includes a fifth portion 62b1 and a sixth portion 62b2. The fifth portion 62b1 has an end located in the medium facing surface 80. The sixth portion 62b2 is located farther from the medium facing surface 80 than is the fifth portion 62b1. There is formed a step 62b3 between the fifth portion 62b1 and the sixth portion 62b2. The first inclined portion 52T1 of the top surface 52T of the main pole 52 includes a seventh portion opposed to the fifth portion 62b1, and an eighth portion opposed to the sixth portion 62b2. The bottom surface 62b has a first end located in the medium facing surface 80 and a second end opposite to the first end. The bottom surface 62b is inclined with respect to the medium facing surface 80 and the direction perpendicular to the medium facing surface 80 such that the second end is located on the front side in the direction of travel of the recording medium relative to the first end.

As shown in FIG. 1, the first gap layer 45 of the gap section 120 has a front end 45a located closest to but at a distance from the medium facing surface 80. The distance from the medium facing surface 80 to the front end 45a is smaller than the distance from the medium facing surface 80 to the fourth end of the second inclined portion 52L1 of the bottom end 52L of the main pole 52. The first gap layer 45 is interposed between the second portion 40b2 of the top surface 40b of the leading shield 40 and the second gap layer 46. The second gap layer 46 has a front end 46a located in the medium facing surface 80. The second gap layer 46 separates the main pole 52 from the leading shield 40, the first and second side shields 50A and 50B and the first gap layer 45.

A portion of the first gap layer 45 that is interposed between the second portion 40b2 and the second gap layer 46 will be referred to as the interposition portion. In this embodiment, the thickness of the interposition portion of the first gap layer 45 is equal to the height of the step 40b3 between the first portion 40b1 and the second portion 40b2 of the top surface 40b of the leading shield 40. Thus, there is no step between the first portion 40b1 and the top surface of the interposition portion of the first gap layer 45. A portion of the second gap layer 46 that lies on the first portion 40b1 and the interposition portion of the first gap layer 45 has a flat top surface.

The second gap layer 46 is interposed between the first portion 40b1 and the third portion 52L11, whereas the first gap layer 45 is not interposed therebetween. The first and second gap layers 45 and 46 are interposed between the second portion 40b2 and the fourth portion 52L12. More specifically, the interposition portion of the first gap layer 45 and the second gap layer 46 are stacked in this order between the second portion 40b2 and the fourth portion 52L12. As previously described, there is no step between the third portion 52L11 and the fourth portion 52L12 which are respectively opposed to the first portion 40b1 and the top surface of the interposition portion of the first gap layer 45.

The third gap layer 60 has a front end located in the medium facing surface 80. The third gap layer 60 separates the trailing shield 62 from the top surface 52T of the main pole 52. The fourth gap layer 61 has a front end located closest to but at a distance from the medium facing surface 80. The distance from the medium facing surface 80 to the front end of the fourth gap layer 61 is smaller than the distance from the medium facing surface 80 to the second end of the first inclined portion 52T1 of the top surface 52T of the main pole 52. The third gap layer 60 is interposed between the fifth portion 62b1 of the bottom surface 62b of the trailing shield 62 and the seventh portion of the first inclined portion 52T1 of the top surface 52T of the main pole 52, whereas the fourth gap layer 61 is not interposed therebetween. The third and fourth gap layers 60 and 61 are interposed between the sixth portion 62b2 of the bottom surface 62b of the trailing shield 62 and the eighth portion of the first inclined portion 52T1 of the top surface 52T of the main pole 52.

A manufacturing method for the magnetic head according to the embodiment will now be described. As shown in FIG. 2 and FIG. 3, the manufacturing method for the magnetic head according to the embodiment first forms the underlying layer 11, the bottom read shield layer 20 and the insulating layer 23 in this order on the substrate 10. Next, the MR element 21 is formed on the bottom read shield layer 20, and the insulating layer 24 is formed on the bottom read shield layer 20 and the insulating layer 23. Then, the top read shield layer 22, the insulating layer 25 and the insulating film 26 are formed in this order on the MR element 21 and the insulating layer 24.

Next, the middle shield layer 30 is formed on the insulating film 26 by frame plating, for example. The insulating layer 31 is then formed to cover the middle shield layer 30. The insulating layer 31 is then polished by, for example, chemical mechanical polishing (hereinafter referred to as CMP), until the middle shield layer 30 is exposed. Then, the insulating film 32 is formed over the entire top surface of the stack. The coil 33 is then formed on the insulating film 32 by frame plating, for example. The insulating layer 34 is then formed to cover the coil 33. The insulating layer 34 is then polished by, for example, CMP, until the coil 33 is exposed. Then, the insulating film 35 is formed over the entire top surface of the stack.

Reference is now made to FIG. 8A to FIG. 24B to describe a series of steps following the formation of the insulating film 35. FIG. 8A to FIG. 24B each show a stack of layers formed in the process of manufacturing the magnetic head. FIG. nA (n is any integer between 8 and 24 inclusive) shows a cross section of the stack taken at the location at which the medium facing surface 80 is to be formed. FIG. nB shows a cross section perpendicular to the medium facing surface 80 and to the top surface of the substrate 10. In FIG. nB, the reference symbol "ABS" denotes an imaginary plane representative of the location at which the medium facing surface 80 is to be formed.

Figure 8A:
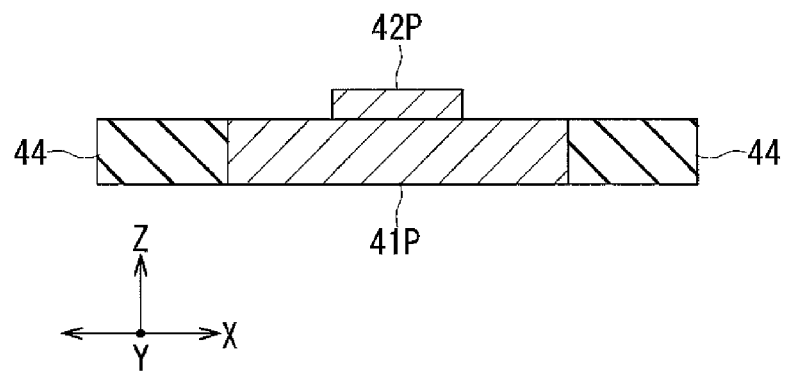
FIG. 8A and FIG. 8B are cross-sectional views showing a step of a manufacturing method for the magnetic head according to the embodiment of the invention.
Figure 8B:
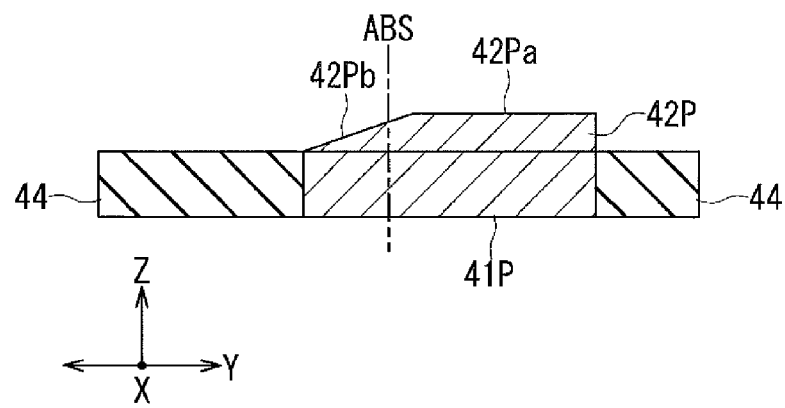

FIG. 8A and FIG. 8B show the step following the formation of the insulating film 35. In this step, first, an initial first layer 41P, which will later become the first layer 41 of the leading shield 40, is formed on the insulating film 35 by frame plating, for example. The insulating layer 44 is then formed to cover the initial first layer 41P. The insulating layer 44 is then polished by, for example, CMP, until the initial first layer 41P is exposed. Next, an initial second layer 42P, which will later become the second layer 42 of the leading shield 40, is formed on the initial first layer 41P by sputtering, for example. Part of the initial second layer 42P is then taper-etched by, for example, ion beam etching. The initial second layer 42P having undergone this etching has a bottom surface, a top surface 42Pa, and an inclined surface 42Pb connecting the top surface 42a and the bottom surface.

Figure 9A:
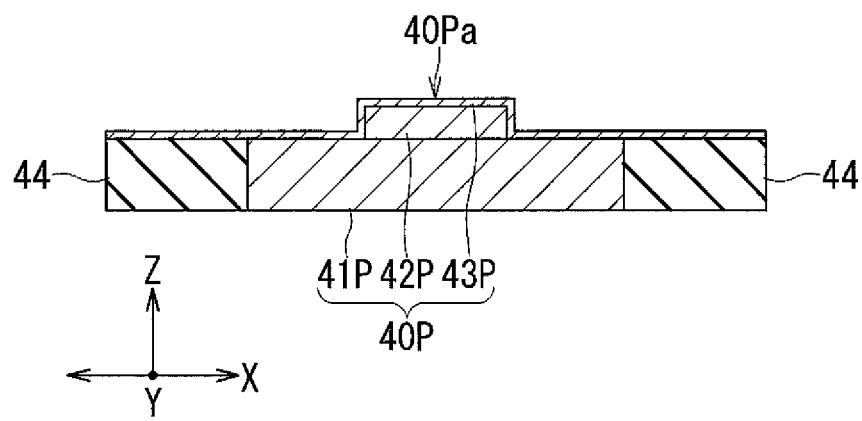
FIG. 9A and FIG. 9B are cross-sectional views showing a step that follows the step shown in FIG. 8A and FIG. 8B.
Figure 9B:
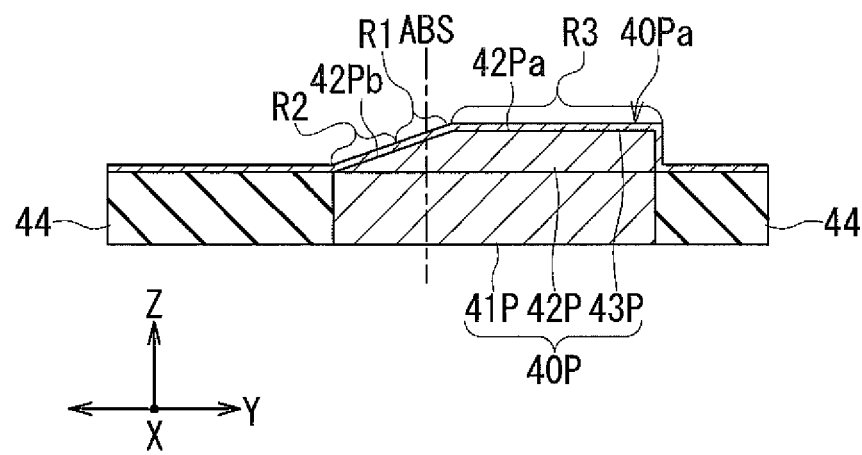

FIG. 9A and FIG. 9B show the next step. In this step, an initial third layer 43P, which will later become the third layer 43 of the leading shield 40, is formed over the entire top surface of the stack.

An initial leading shield 40P is formed through a series of steps from the step shown in FIGS. 8A and 8B to the step shown in FIGS. 9A and 9B. The initial leading shield 40P is constituted by the initial first layer 41P, the initial second layer 42P and the initial third layer 43P. The initial leading shield 40P has a top surface 40Pa.

The top surface 40Pa includes a first region R1, a second region R2 and a third region R3. The first region R1 and the second region R2 are located above the inclined surface 42Pb of the initial second layer 42P. The third region R3 is located above the top surface 42Pa of the initial second layer 42P.

The first region R1 is a region to become the first portion 40b1 of the top surface 40b of the leading shield 40. The second region R2 is a region to be etched later to form the second portion 40b2 of the top surface 40b of the leading shield 40. The third region R3 is included in a part of the initial leading shield 40P to be removed later. The first region R1 is located between the second region R2 and the third region R3. The first region R1 and the second region R2 are each inclined at the same angle as is the first portion 40b1 of the top surface 40b to be formed later. The third region R3 is parallel to the top surface of the substrate 10.

Figure 10A:
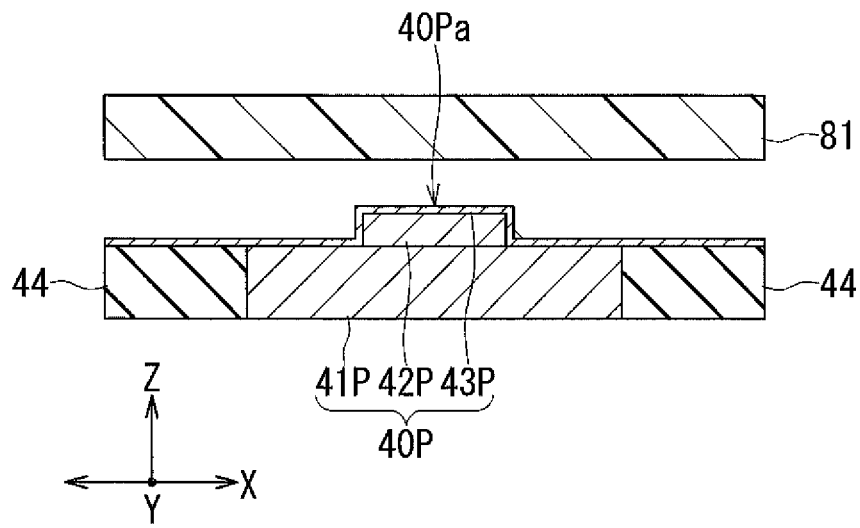
FIG. 10A and FIG. 10B are cross-sectional views showing a step that follows the step shown in FIG. 9A and FIG. 9B.
Figure 10B:
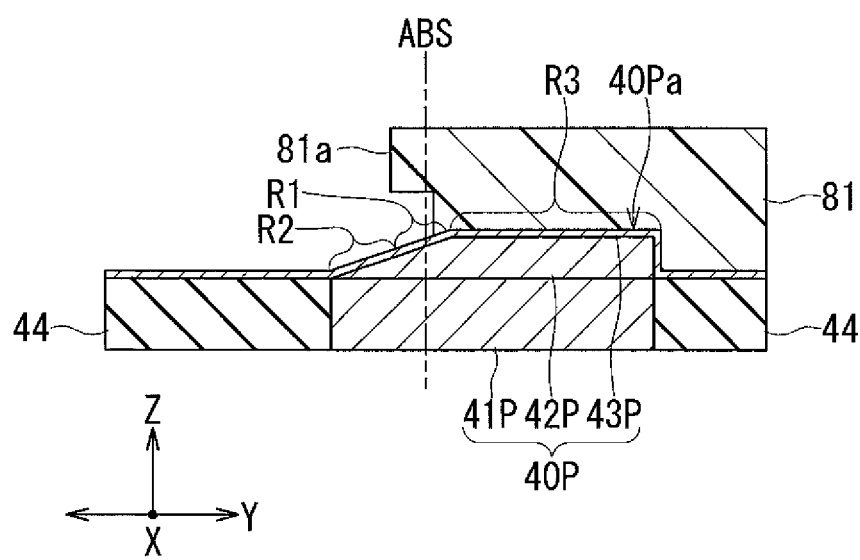

FIG. 10A and FIG. 10B show the next step. In this step, a mask 81 is formed on the stack. The mask 81 is in contact with the third region R3 of the top surface 40Pa of the initial leading shield 40P. As shown in FIG. 10B, the mask 81 may also be in contact with the first region R1. However, the mask 81 is not in contact with the second region R2. The mask 81 includes an overhang portion 81a located above the first region R1. The overhang portion 81a has an end face for defining the location of the step 40b3.

Figure 11A:
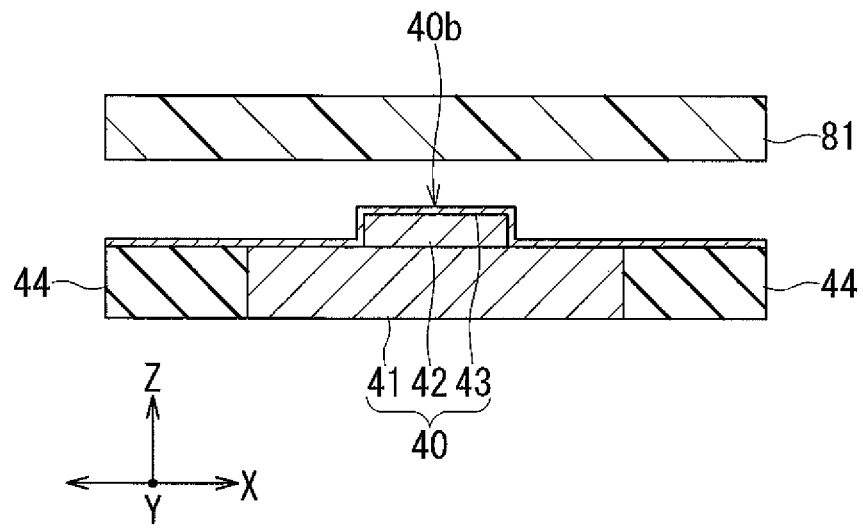
FIG. 11A and FIG. 11B are cross-sectional views showing a step that follows the step shown in FIG. 10A and FIG. 10B.
Figure 11B:
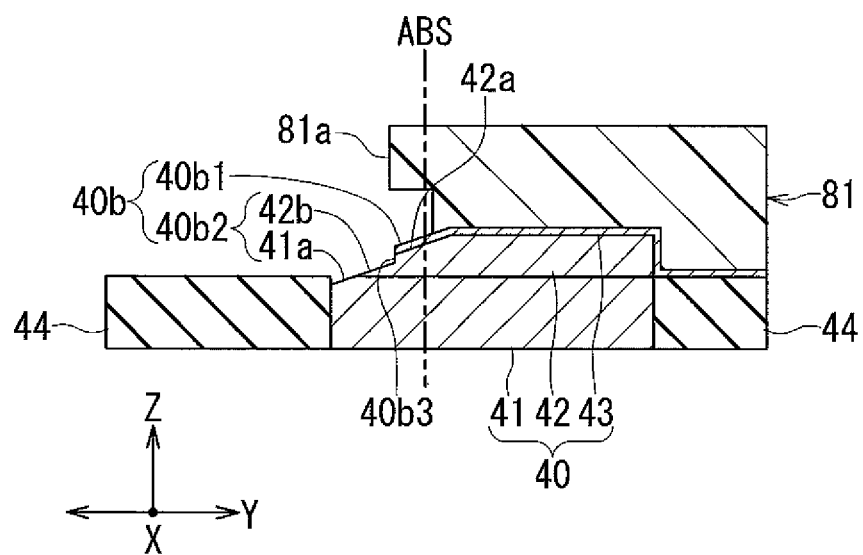

FIG. 11A and FIG. 11B show the next step. In this step, the second region R2 (see FIG. 10B) of the top surface 40Pa of the initial leading shield 40P is etched by, for example, ion beam etching, using the mask 81. This makes the first region R1 (see FIG. 10B) into the first portion 40b1 of the top surface 40b. Further, the etching of the second region R2 results in the formation of the second portion 40b2 of the top surface 40b. As a result, the step 40b3 is formed between the first portion 40b1 and the second portion 40b2. The aforementioned etching makes the initial leading shield 40P into the leading shield 40. The initial first layer 41P, the initial second layer 42P and the initial third layer 43P become the first layer 41, the second layer 42 and the third layer 43, respectively. The inclined surface 41a of the first layer 41 is formed by etching of a portion of the top surface of the initial first layer 41P. The second inclined portion 42b of the top surface of the second layer 42 is formed by etching of a portion of the inclined surface 42Pb of the initial second layer 42P. A portion of the inclined surface 42Pb of the initial second layer 42P that remains after the etching makes the first inclined portion 42a of the top surface of the second layer 42.

Figure 12A:
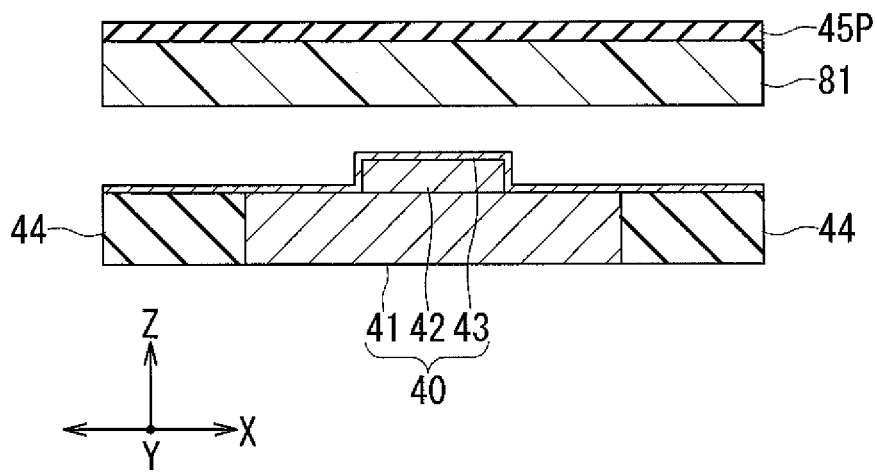
FIG. 12A and FIG. 12B are cross-sectional views showing a step that follows the step shown in FIG. 11A and FIG. 11B.
Figure 12B:
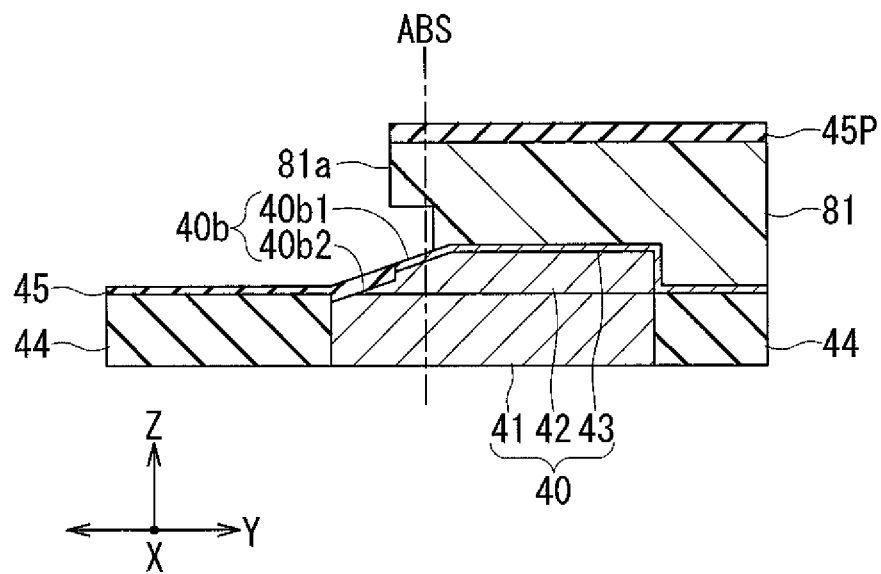
Figure 13A:
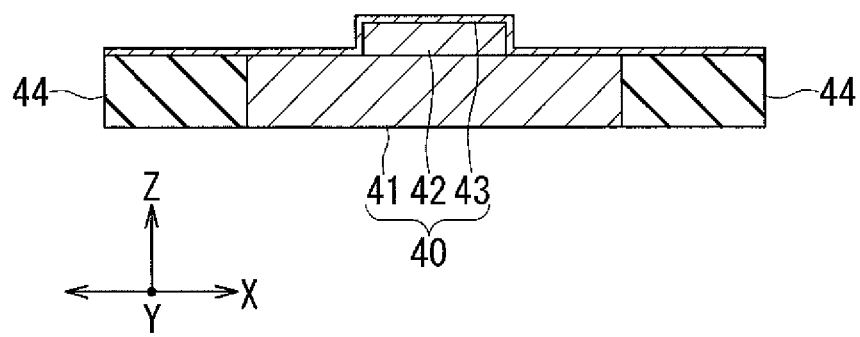
FIG. 13A and FIG. 13B are cross-sectional views showing a step that follows the step shown in FIG. 12A and FIG. 12B.
Figure 13B:
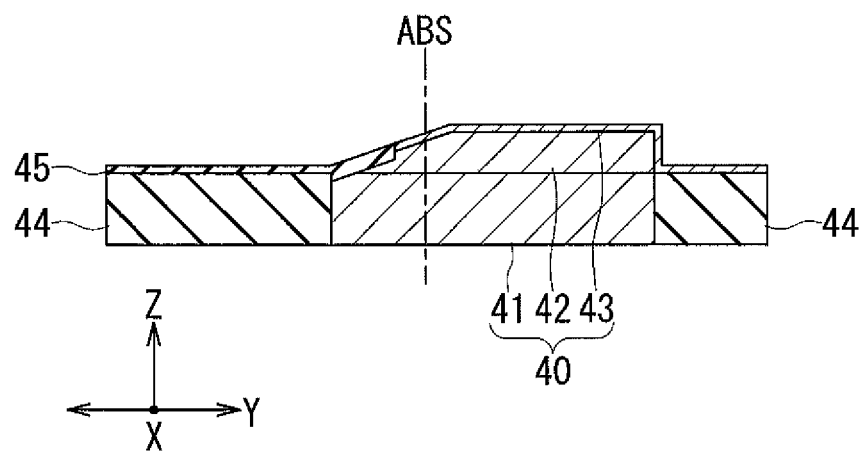

FIG. 12A and FIG. 12B show the next step. In this step, in the presence of the mask 81, the first gap layer 45 is formed on the second portion 40b2 by ion beam deposition, for example. The first gap layer 45 is formed also on the insulating layer 44. The material for forming the first gap layer 45 is deposited also onto the surface of the mask 81. In FIG. 12A and FIG. 12B, the reference symbol 45P represents a portion of the material for forming the first gap layer 45 deposited on the surface of the mask 81. The mask 81 is then removed (lifted off) as shown in FIG. 13A and FIG. 13B.

Figure 14A:
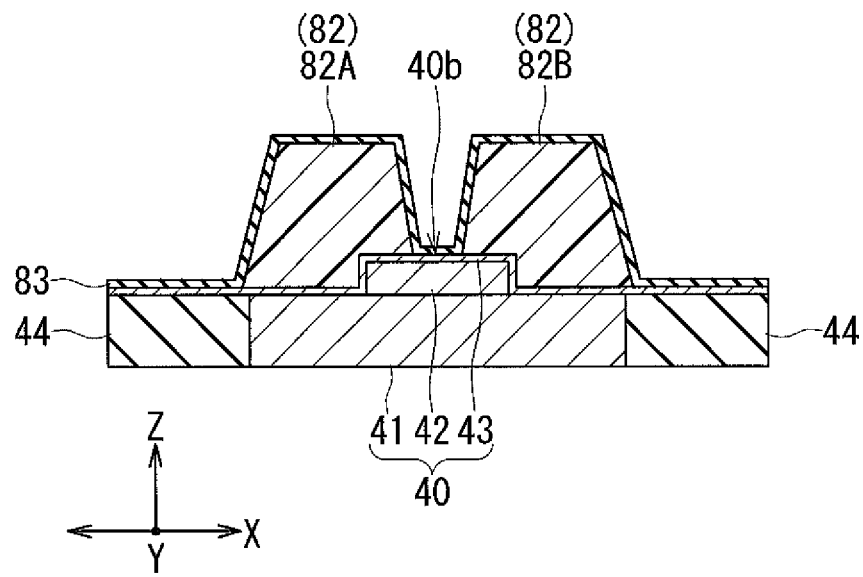
FIG. 14A and FIG. 14B are cross-sectional views showing a step that follows the step shown in FIG. 13A and FIG. 13B.
Figure 14B:
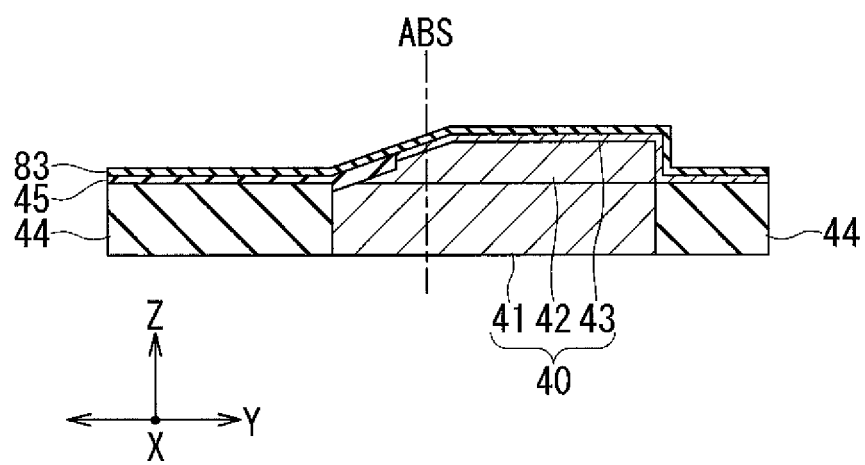

FIG. 14A and FIG. 14B show the next step. In this step, first, a photoresist layer made of a positive photoresist is patterned by photolithography to form a first resist layer 82 on the regions of the top surface 40b of the leading shield 40 where the first and second side shields 50A and 50B are to be formed later. The first resist layer 82 includes a first portion 82A shaped to correspond to the shape of the first side shield 50A to be formed later, and a second portion 82B shaped to correspond to the shape of the second side shield 50B to be formed later. Next, a separating film 83 made of a nonmagnetic material is formed to cover the first resist layer 82. The separating film 83 is provided to prevent the first resist layer 82 made of a positive photoresist from being mixed with a photoresist layer that is to be formed later from a negative photoresist. Examples of materials suitable for the separating film 83 include alumina and a synthetic resin. Where alumina is selected as the material of the separating film 83, the separating film 83 is formed by atomic layer deposition, for example.

Figure 15A:
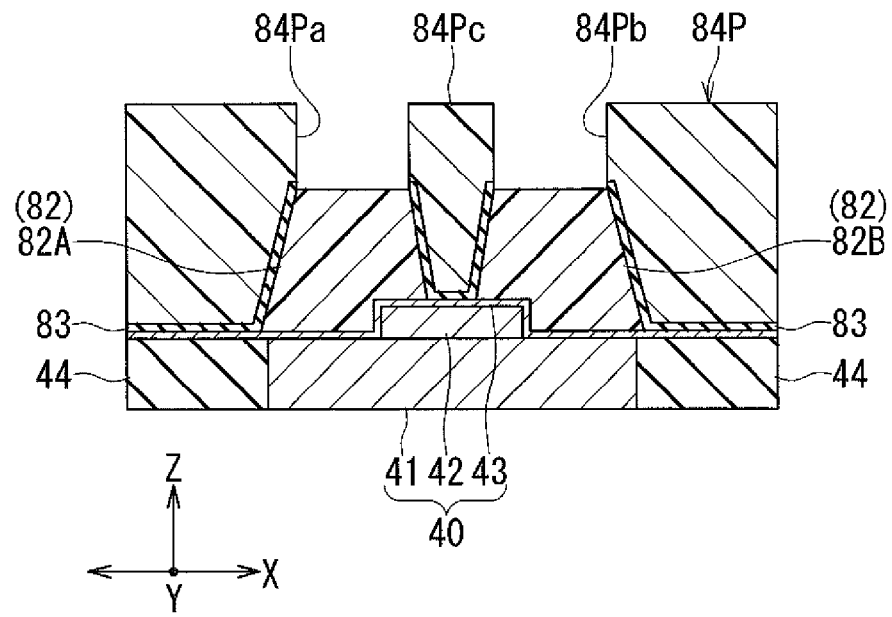
FIG. 15A and FIG. 15B are cross-sectional views showing a step that follows the step shown in FIG. 14A and FIG. 14B.
Figure 15B:
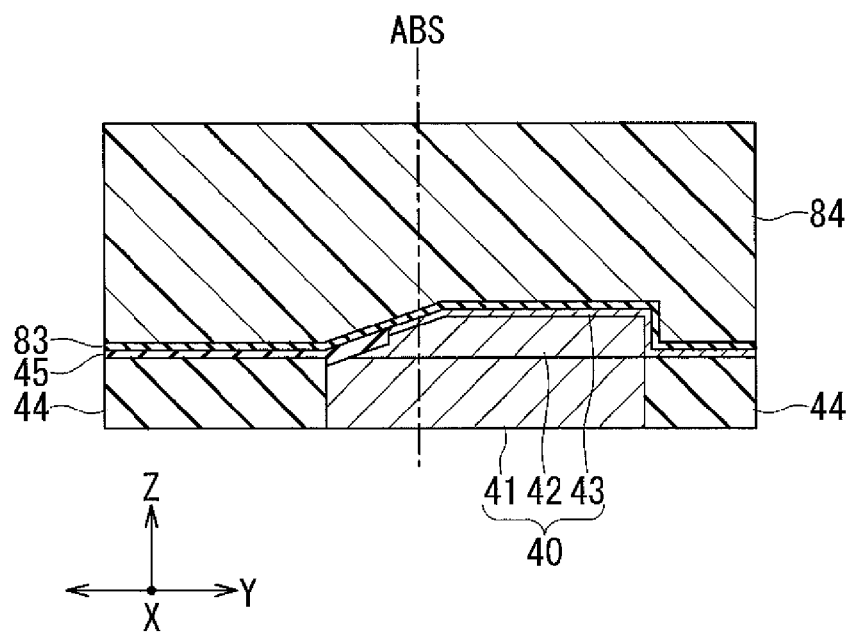

FIG. 15A and FIG. 15B show the next step. In this step, first, a photoresist layer made of a negative photoresist is patterned by photolithography to form a second resist layer 84P on the separating film 83. The second resist layer 84P will later become the mold. The second resist layer 84P has an opening 84Pa shaped to correspond to the shape of the first side shield 50A to be formed later, an opening 84Pb shaped to correspond to the shape of the second side shield 50B to be formed later, and an initial midsection 84Pc located between the opening 84Pa and the opening 84Pb. Next, portions of the separating film 83 not covered by the second resist layer 84P are removed by wet etching, for example.

Figure 16A:
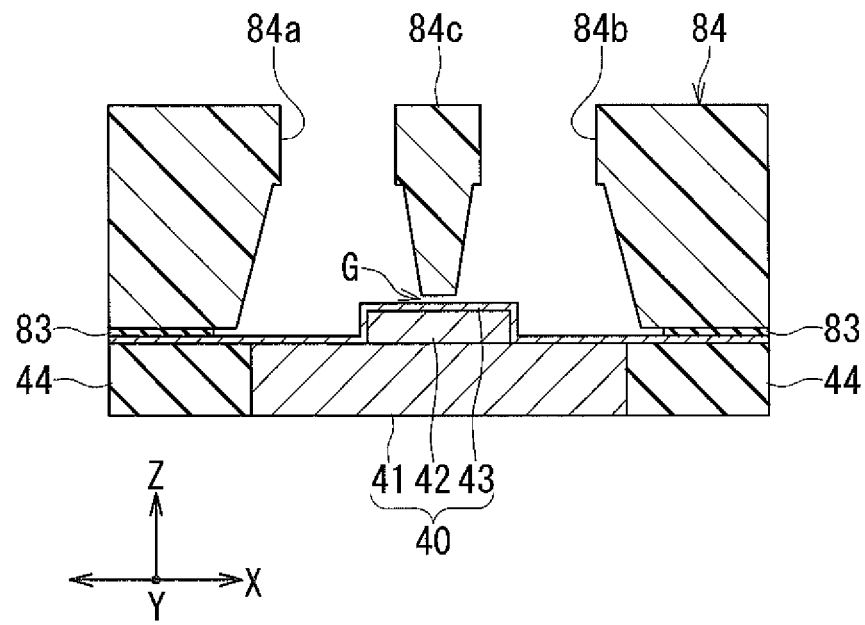
FIG. 16A and FIG. 16B are cross-sectional views showing a step that follows the step shown in FIG. 15A and FIG. 15B.
Figure 16B:
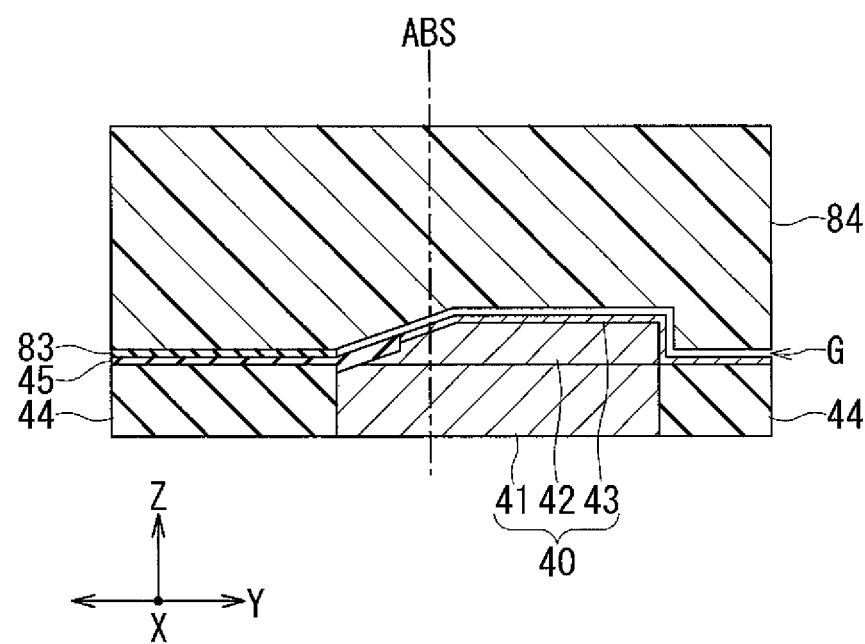

FIG. 16A and FIG. 16B show the next step. In this step, the first resist layer 82 and at least part of the separating film 83 are removed so that the second resist layer 84P remains to become the mold 84. More specifically, first, the entire top surface of the stack is exposed to light. Having undergone the exposure, the first resist layer 82 made of a positive photoresist becomes soluble in a developing solution, while the second resist layer 84P made of a negative photoresist remains insoluble in the developing solution. Next, the first resist layer 82 is removed from the openings 84Pa and 84Pb of the second resist layer 84P by using an alkaline developing solution, for example. In this step, portions of the separating film 83 extending along the wall faces of the openings 84Pa and 84Pb of the second resist layer 84P are also removed at the same time the first resist layer 82 is removed, or by wet etching after the first resist layer 82 is removed. This makes the second resist layer 84P into the mold 84. A series of steps from the step shown in FIGS. 14A and 14B to the step shown in FIGS. 16A and 16B corresponds to the step of forming the mold in the present invention.

The mold 84 includes a first receiving section 84a for receiving the first side shield 50A, a second receiving section 84b for receiving the second side shield, and a midsection 84c located between the first receiving section 84a and the second receiving section 84b and forming a gap G between the first portion 40b1 and the first gap layer 45. The first receiving section 84a, the second receiving section 84b and the midsection 84c correspond to the opening 84Pa, the opening 84Pb, and the initial midsection 84Pc of the second resist layer 84P, respectively. The gap G is formed by removing a portion of the separating film 83 lying under the initial midsection 84Pc. Even if the gap G is formed, the mold 84 will not peel off because most part of the separating film 83 lying under the mold 84 remains unremoved.

Figure 17A:
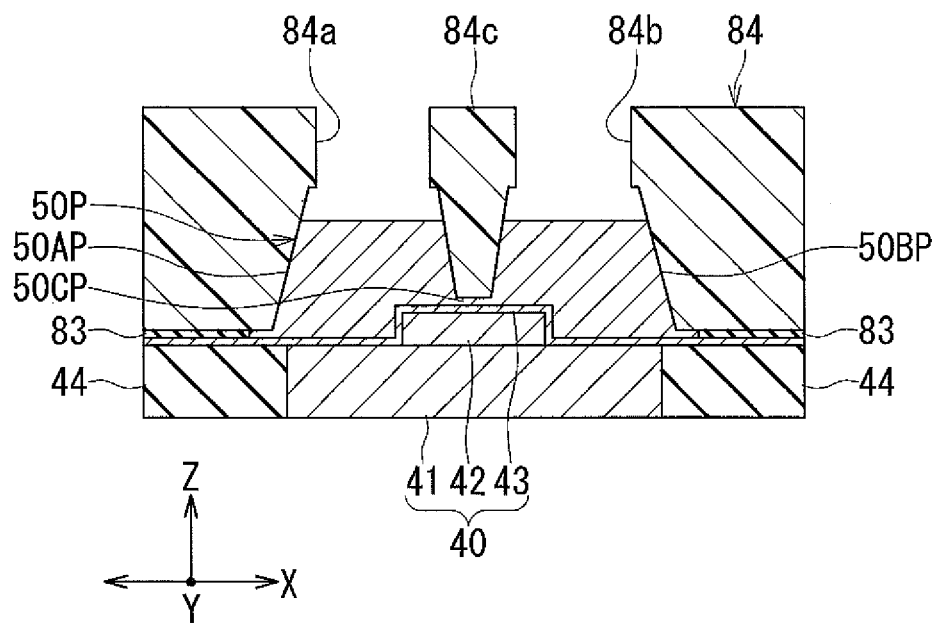
FIG. 17A and FIG. 17B are cross-sectional views showing a step that follows the step shown in FIG. 16A and FIG. 16B.
Figure 17B:
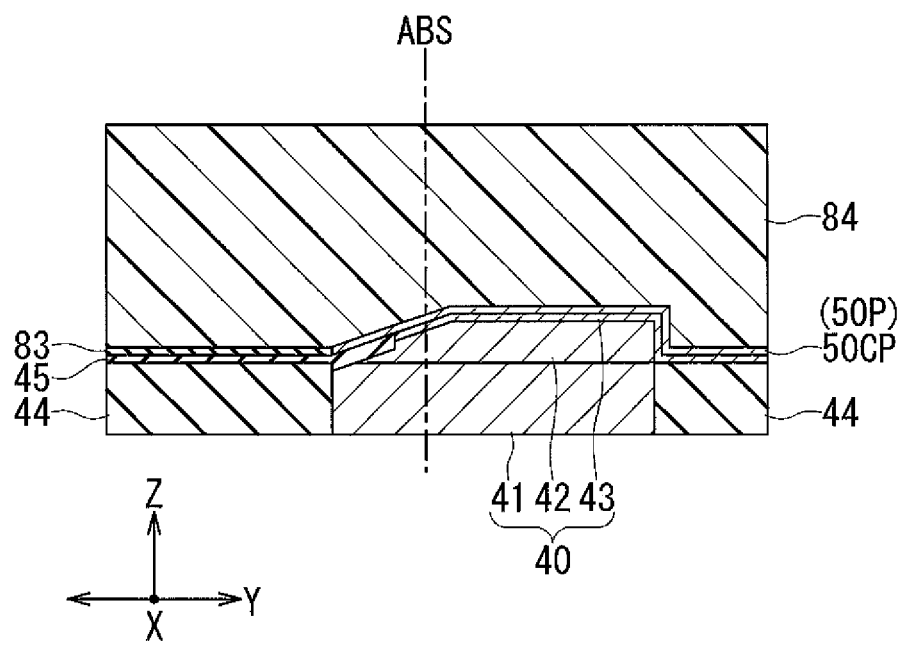
Figure 18A:
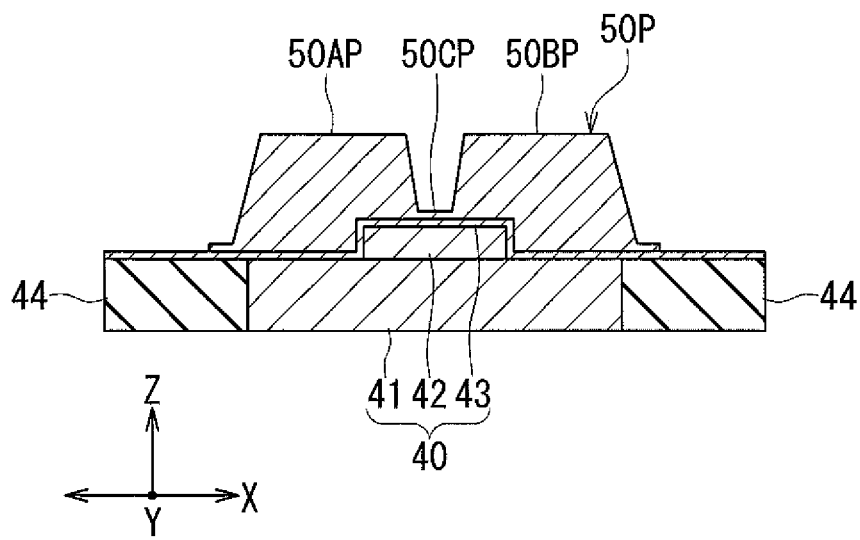
FIG. 18A and FIG. 18B are cross-sectional views showing a step that follows the step shown in FIG. 17A and FIG. 17B.
Figure 18B:
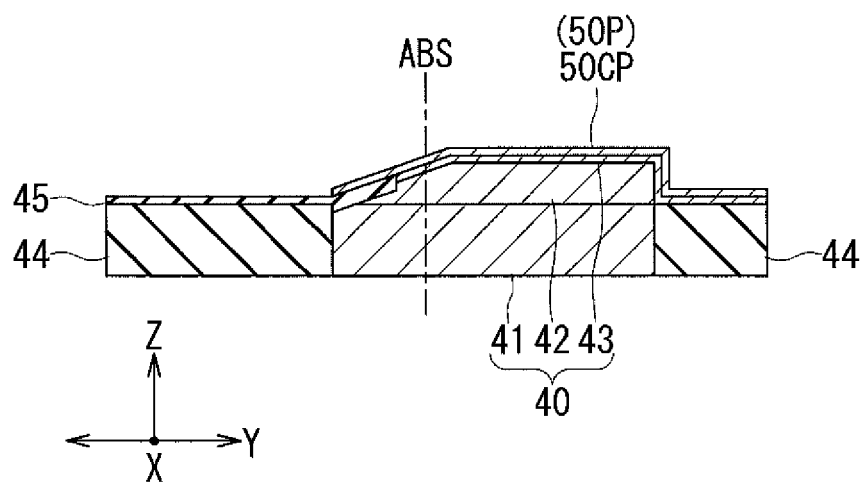

FIG. 17A and FIG. 17B show the next step. In this step, a magnetic layer 50P is formed by plating, using the third layer 43 as a seed and an electrode. The magnetic layer 50P includes an initial first side shield 50AP received in the first receiving section 84a, an initial second side shield 50BP received in the second receiving section 84b, and a coupling section 50CP lying in the gap G and coupling the initial first side shield 50AP and the initial second side shield 50BP to each other. The coupling section 50CP is formed by the material of the magnetic layer 50P getting into the gap G (see FIG. 16A and FIG. 16B). The coupling section 50CP is interposed between the leading shield 40 and a region where the main pole 52 is to be formed. Next, the mold 84 and the separating film 83 are removed as shown in FIG. 18A and FIG. 18B.

Figure 19A:
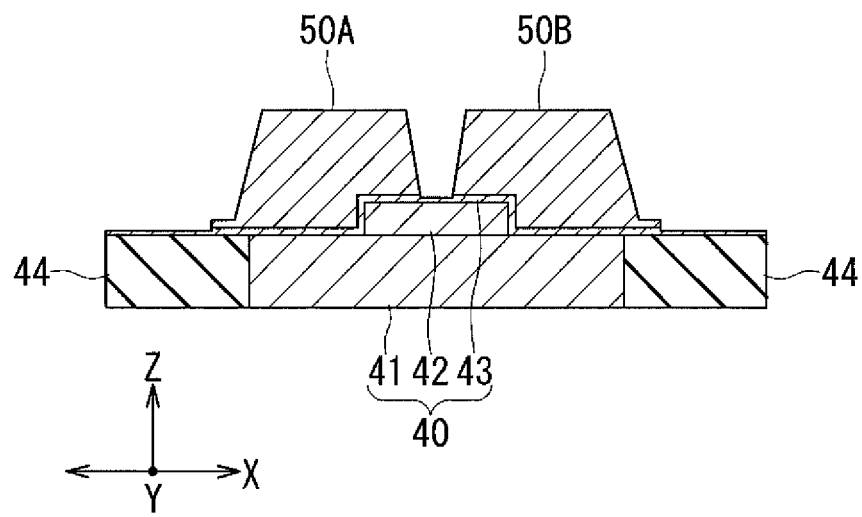
FIG. 19A and FIG. 19B are cross-sectional views showing a step that follows the step shown in FIG. 18A and FIG. 18B.
Figure 19B:
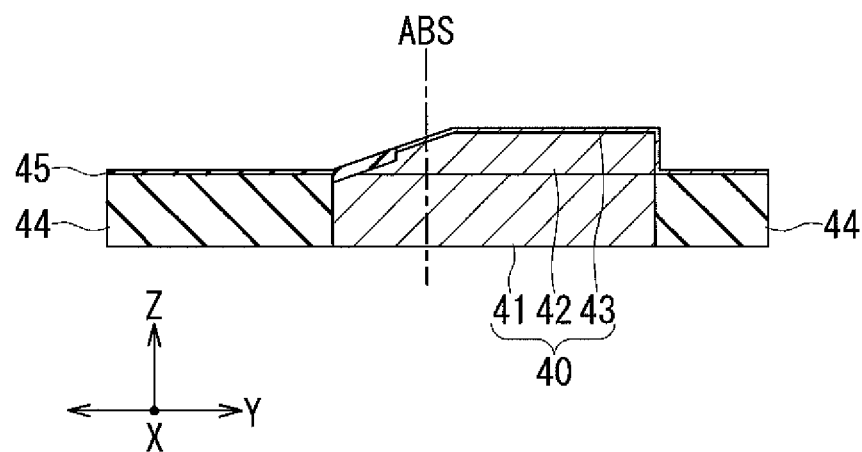

FIG. 19A and FIG. 19B show the next step. In this step, the coupling section 50CP is removed by etching the magnetic layer 50P by, for example, ion beam etching, so that the initial first side shield 50AP becomes the first side shield 50A and the initial second side shield 50BP becomes the second side shield 50B. In this step, the magnetic layer 50P may be over-etched such that the etching in the region between the first side shield 50A and the second side shield 50B terminates at the third layer 43 or the second layer 42 of the leading shield 40. In this case, a part of the third layer 43 lying between the coupling section 50CP before etched and the second layer 42 may be completely removed.

Figure 20A:
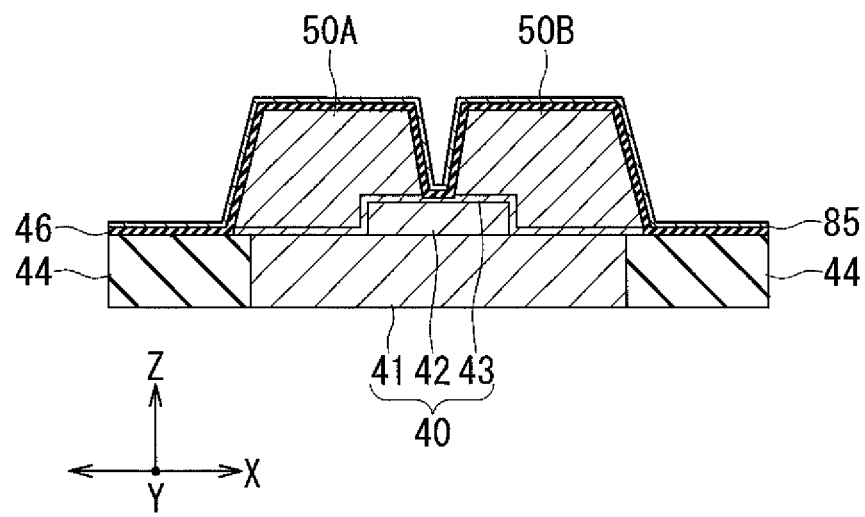
FIG. 20A and FIG. 20B are cross-sectional views showing a step that follows the step shown in FIG. 19A and FIG. 19B.
Figure 20B:
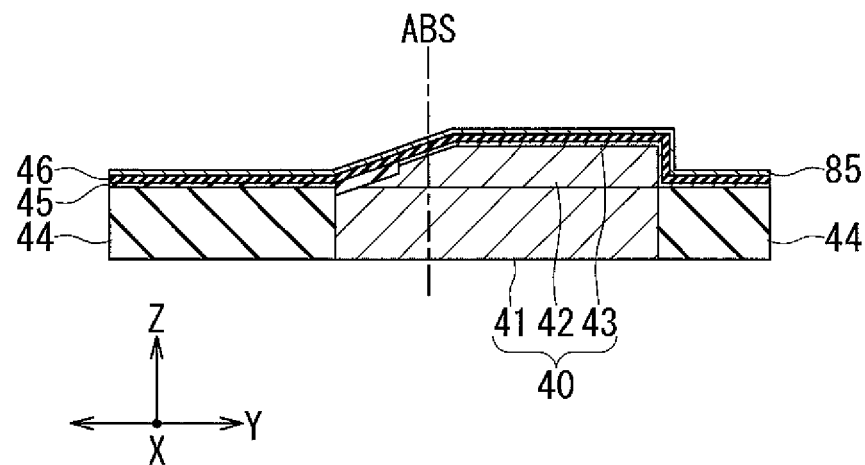

FIG. 20A and FIG. 20B show the next step. In this step, first, a mask (not illustrated) is formed to cover the first and second side shields 50A and 50B. The mask is formed by patterning a photoresist layer. Next, portions of the third layer 43 that are not covered with the mask are removed by ion beam etching, for example. The mask is then removed. Next, the second gap layer 46 is formed over the entire top surface of the stack. A seed layer 85 is then formed over the entire top surface of the stack. The seed layer 85 is used as an electrode and a seed when forming the main pole 52 by plating.

Figure 21A:
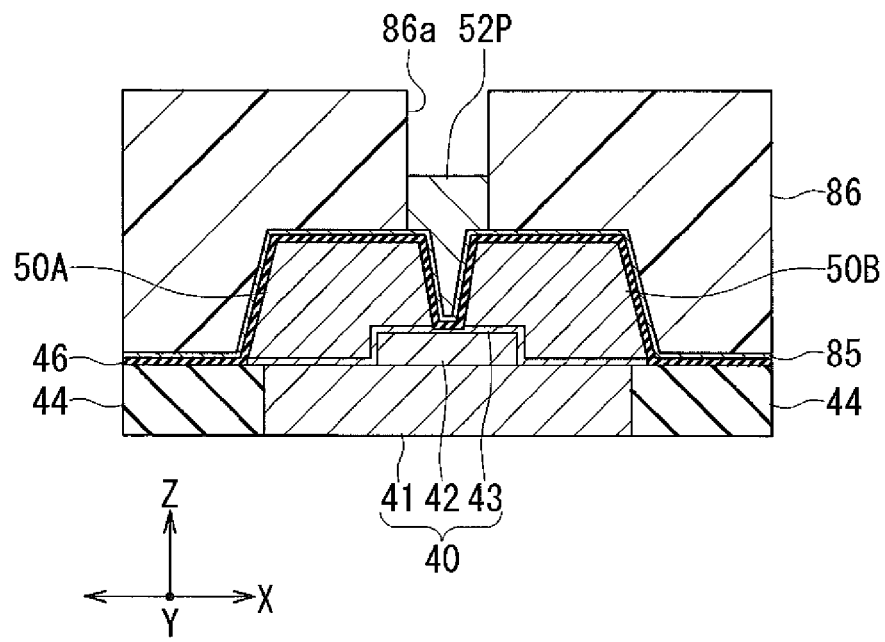
FIG. 21A and FIG. 21B are cross-sectional views showing a step that follows the step shown in FIG. 20A and FIG. 20B.
Figure 21B:
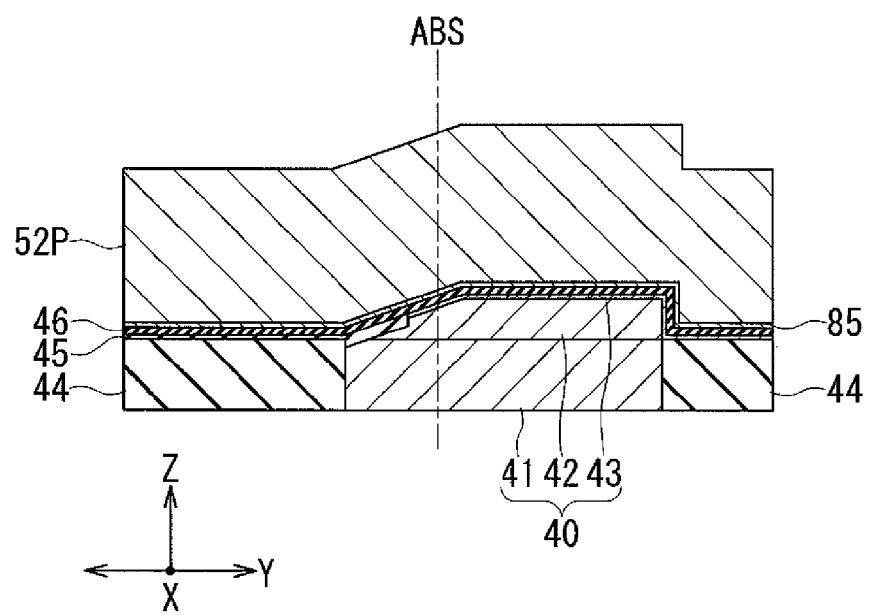

FIG. 21A and FIG. 21B show the next step. In this step, first, a third resist layer 86 is formed on the stack. The third resist layer 86 is formed such that its top surface is higher in level than the top surfaces of portions of the seed layer 85 lying on the first and second side shields 50A and 50B. The third resist layer 86 has an opening 86a shaped to correspond to the shape of the main pole 52 to be formed later. Next, an initial main pole 52P, which will later become the main pole 52, is formed in the opening 86a of the third resist layer 86 by performing plating with the seed layer 85 used as an electrode and a seed layer. The initial main pole 52P is formed such that its top surface is higher in level than the top surfaces of the portions of the seed layer 85 lying on the first and second side shields 50A and 50B.

Figure 22A:
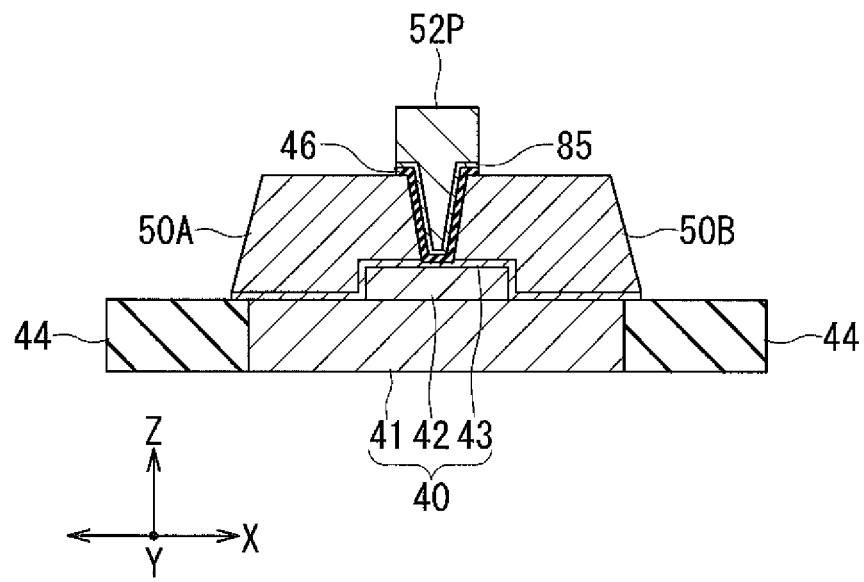
FIG. 22A and FIG. 22B are cross-sectional views showing a step that follows the step shown in FIG. 21A and FIG. 21B.
Figure 22B:
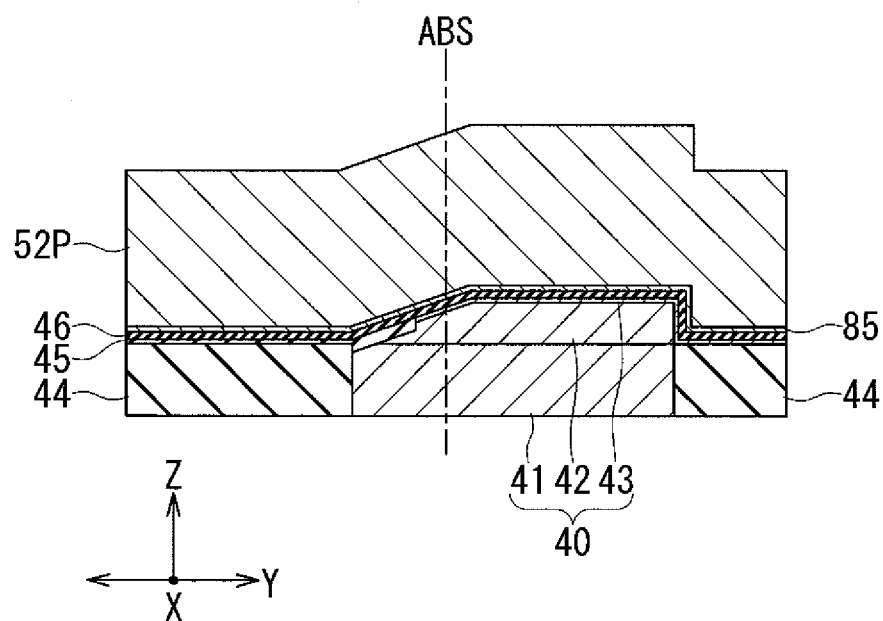

FIG. 22A and FIG. 22B show the next step. In this step, first, the third resist layer 86 is removed. Then, portions of the second gap layer 46 and the seed layer 85 that are not covered with the initial main pole 52P are removed by, for example, ion beam etching using the initial main pole 52P as an etching mask.

Figure 23A:
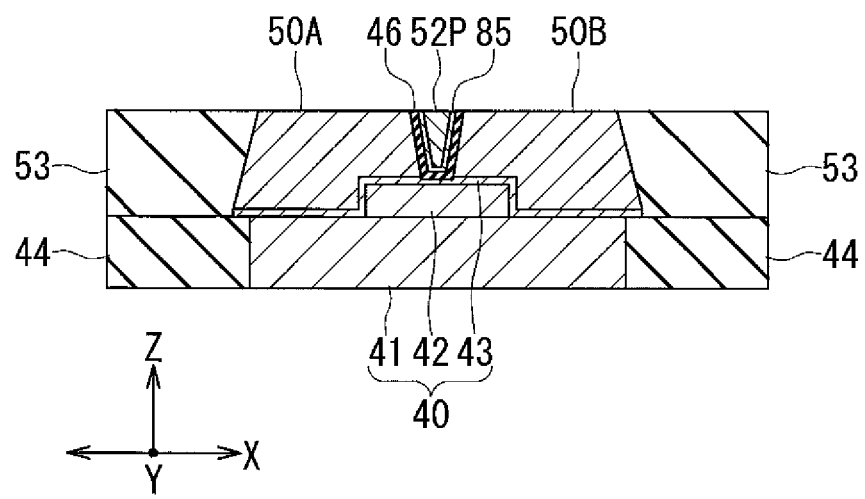
FIG. 23A and FIG. 23B are cross-sectional views showing a step that follows the step shown in FIG. 22A and FIG. 22B.
Figure 23B:
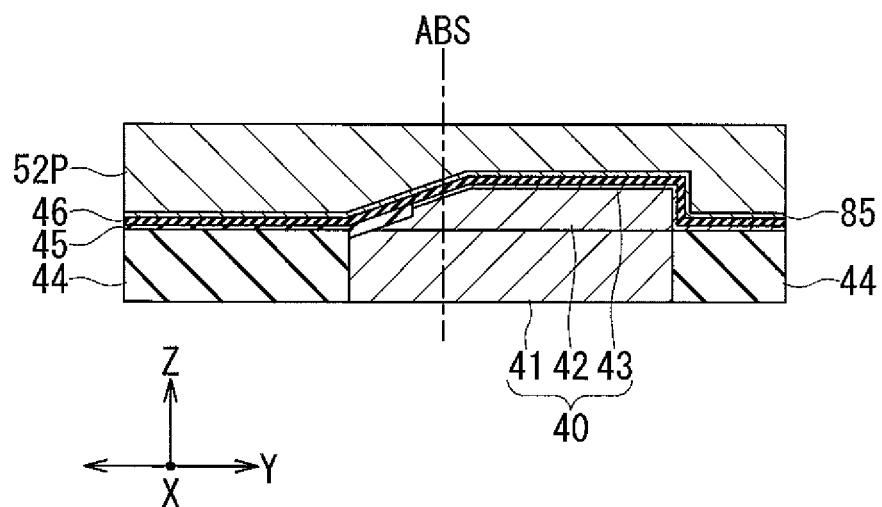

FIG. 23A and FIG. 23B show the next step. In this step, first, the nonmagnetic layer 53 is formed over the entire top surface of the stack. The second gap layer 46, the initial main pole 52P, the nonmagnetic layer 53 and the seed layer 85 are then polished by, for example, CMP, until the first and second side shields 50A and 50B are exposed.

Figure 24A:
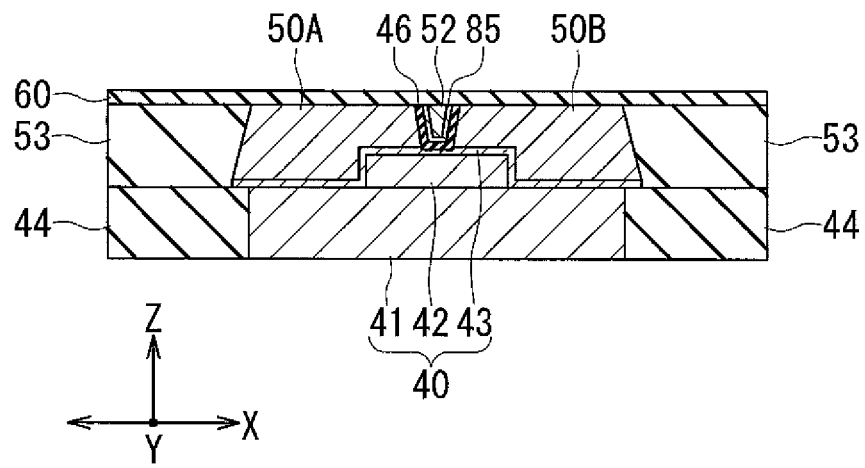
FIG. 24A and FIG. 24B are cross-sectional views showing a step that follows the step shown in FIG. 23A and FIG. 23B.
Figure 24B:
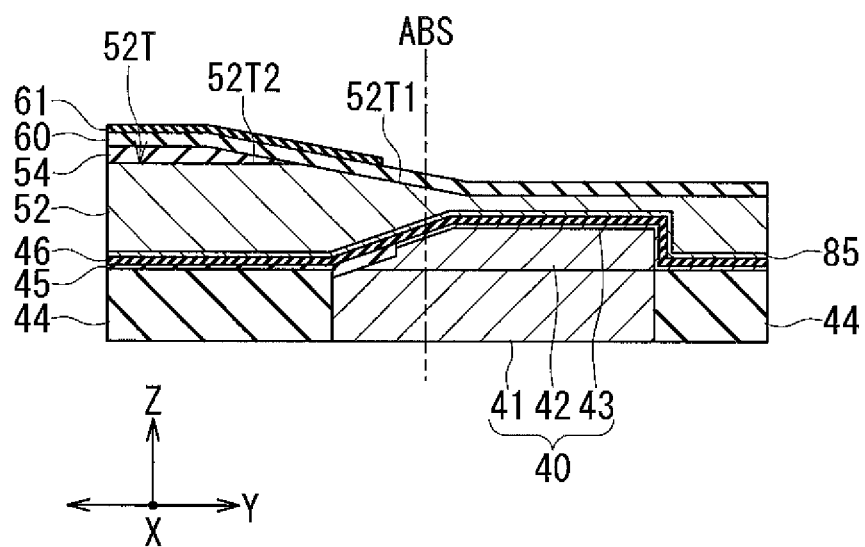

FIG. 24A and FIG. 24B show the next step. In this step, first, the nonmagnetic layer 54 is formed on the top surface of the initial main pole 52P. Then, the first and side shields 50A and 50B, the initial main pole 52P, the second gap layer 46 and the nonmagnetic layers 53 and 54 are taper-etched in part by, for example, ion beam etching, so as to provide the top surface of the initial main pole 52P with the first inclined portion 52T1 and provide the nonmagnetic layer 54 with the end face mentioned previously. This makes the initial main pole 52P into the main pole 52. A portion of the top surface of the initial main pole 52P that remains after the etching makes the first flat portion 52T2. Next, the third gap layer 60 is formed over the entire top surface of the stack. Then, the fourth gap layer 61 is formed on the third gap layer 60. The fourth gap layer 61 may be formed by a lift-off process, or by first forming a nonmagnetic film on the third gap layer 60 and then etching a portion of the nonmagnetic film.

Now, steps to follow the formation of the fourth gap layer 61 will be described with reference to FIG. 2 and FIG. 3. First, the third and fourth gap layers 60 and 61 are selectively etched to form therein three openings for exposing the top surfaces of the first and second side shields 50A and 50B and the main pole 52. Then, the trailing shield 62 is formed on the first and second side shields 50A and 50B and the third and fourth gap layers 60 and 61, and the first yoke layer 63 is formed on the main pole 52, by frame plating, for example. Next, the insulating layer 64 is formed to cover the trailing shield 62 and the first yoke layer 63. The insulating layer 64 is then polished by, for example, CMP, until the trailing shield 62 and the first yoke layer 63 are exposed.

Next, the insulating film 65 is formed over the entire top surface of the stack. The coil 66 is then formed on the insulating film 65 by frame plating, for example. Then, the insulating film 67 is formed to cover the coil 66. The insulating films 65 and 67 are then selectively etched to form therein openings for exposing the top surfaces of the trailing shield 62 and the first yoke layer 63. Next, the second yoke layer 68 is formed on the trailing shield 62, the first yoke layer 63 and the insulating film 67 by frame plating, for example.

Next, the protective layer 69 is formed to cover the entire top surface of the stack. Then, wiring, terminals and other components are formed on the protective layer 69, the substrate 10 is cut near the imaginary plane ABS, the cut surface is polished to form the medium facing surface 80, and processing such as fabrication of flying rails is performed to complete the magnetic head.

Now, a description will be given of the effect of the manufacturing method for the magnetic head according to the embodiment. The magnetic head manufactured by the manufacturing method according to the embodiment allows reduction in the occurrence of unwanted erasure and improvement of recording density by virtue of the function of the write shield 110. In the embodiment, the second gap layer 46 is interposed between the first portion 40b1 of the top surface 40b of the leading shield 40 and the third portion 52L11 of the bottom end 52L of the main pole 52, whereas the first gap layer 45 is not interposed therebetween. On the other hand, the first and second gap layers 45 and 46 are interposed between the second portion 40b2 of the top surface 40b of the leading shield 40 and the fourth portion 52L12 of the bottom end 52L of the main pole 52. The embodiment thus makes it possible to reduce leakage of magnetic flux from the main pole 52 to the leading shield 40 by increasing the distance between the bottom end 52L of the main pole 52 and the top surface 40b of the leading shield 40 at a location apart from the medium facing surface 80 through the use of the first and second gap layers 45 and 46, while allowing the end face 52a of the main pole 52 and the leading shield end face 40a to be at a desired distance from each other in the medium facing surface 80 through the use of the second gap layer 46.

If there exists a step between the third portion 52L11 and the fourth portion 52L12 of the bottom end 52L, magnetic flux becomes more likely to leak out of the main pole 52 at the boundary between the third portion 52L11 and the fourth portion 52L12. In the embodiment, there is no step between the third portion 52L11 and the fourth portion 52L12. The embodiment thus makes it possible to reduce leakage of magnetic flux out of the main pole 52 when compared with the case where there is a step between the third portion 52L11 and the fourth portion 52L12.

In the embodiment, the third gap layer 60 is interposed between the fifth portion 62b1 of the bottom surface 62b of the trailing shield 62 and the seventh portion of the top surface 52T of the main pole 52, whereas the fourth gap layer 61 is not interposed therebetween. On the other hand, the third and fourth gap layers 60 and 61 are interposed between the sixth portion 62b2 of the bottom surface 62b of the trailing shield 62 and the eighth portion of the top surface 52T of the main pole 52. The embodiment thus makes it possible to reduce leakage of magnetic flux from the main pole 52 to the trailing shield 62 by increasing the distance between the top surface 52T of the main pole 52 and the bottom surface 62b of the trailing shield 62 at a location apart from the medium facing surface 80 through the use of the third and fourth gap layers 60 and 61, while allowing the end face 52a of the main pole 52 and the trailing shield end face 62a to be at a desired distance from each other in the medium facing surface 80 through the use of the third gap layer 60.

In the manufacturing method according to the embodiment, after the formation of the magnetic layer 50P including the coupling section 50CP interposed between the leading shield 40 and the region where the main pole 52 is to be formed, the mold 84 is removed and then the coupling section 50CP is removed by etching the magnetic layer 50P. The embodiment thus makes it possible to prevent a volume reduction of the main pole 52 and degradation of the write characteristics of the magnetic head attributable to the coupling section 50CP.

The strength of the write magnetic field at or in the vicinity of the top edge of the end face of the main pole, which will hereinafter be referred to as the write field strength, and the gradient of change in the write field strength in the track width direction, which will hereinafter be referred to as the write field gradient, are important characteristics of the write head unit. The write field strength is connected with the write characteristics of the magnetic field. The higher the write field strength, the better the overwrite property. The write field gradient is connected with the occurrence of unwanted erasure. The larger the write field gradient, the greater the effect of reducing the occurrence of unwanted erasure.

In typical magnetic heads, the write field strength and the write field gradient are traded off. Now, a magnetic head of a comparative example having the following structure will be contemplated as an example of typical magnetic heads. The magnetic head of the comparative example does not have the first gap layer 45. Further, in the magnetic head of the comparative example, the top surface 40b of the leading shield 40 does not have the step 40b3, so that the first portion 40b1 and the second portion 40b2 are continuous with each other. The remainder of configuration of the magnetic head of the comparative example is the same as that of the magnetic head according to the embodiment.

The magnetic head of the comparative example is designed to provide a write field gradient of a desired value. In this case, the magnetic head of the comparative example cannot achieve a sufficient increase in the value of the write field strength due to the aforementioned relationship between the write field strength and the write field gradient.

In contrast to the magnetic head of the comparative example, the magnetic head according to the embodiment is able to reduce leakage of magnetic flux from the main pole 52 to the leading shield 40 without the need for changing the distance between the end face 52a of the main pole 52 and the leading shield end face 40a and the distance between the end face 52a of the main pole 52 and each of the first and second side shield end faces 50Aa and 50Ba. Thus, in contrast to the magnetic head of the comparative example, the magnetic head according to the embodiment is able to make the write field strength noticeably higher without necessitating much reduction in the write field gradient. In other words, the magnetic head according to the embodiment is able to provide a write field strength of a sufficiently large value, and also able to prevent the occurrence of unwanted erasure.

In this embodiment, both of the distance from the medium facing surface 80 to the step 40b3 and the height (the dimension in the X direction) of the step 40b3 are connected with the write field strength and the write field gradient. More specifically, in the embodiment, as the distance from the medium facing surface 80 to the step 40b3 increases, the write field strength decreases whereas the write field gradient increases. Further, as the height of the step 40b3 increases, the write field strength increases whereas the write field gradient decreases. Thus, in the embodiment, the write field strength and the write field gradient can be adjusted by controlling the distance from the medium facing surface 80 to the step 40b3 and the height of the step 40b3.

In order for the magnetic head according to the embodiment to achieve a noticeably higher write field strength with less reduction in the write field gradient when compared with the magnetic head of the comparative example, the distance from the medium facing surface 80 to the step 40b3 preferably falls within the range of 50 to 110 nm, and the height of the step 40b3 preferably falls within the range of 5 to 25 nm.

By virtue of the foregoing features, this embodiment allows for manufacture of a magnetic head that is capable of preventing the occurrence of unwanted erasure and is less prone to degradation of write characteristics.

Figure 25:
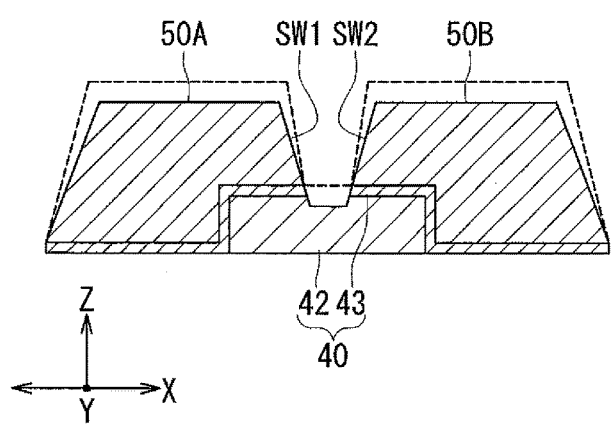
FIG. 25 is a cross-sectional view showing an example of a magnetic layer having undergone the etching of a portion of each of an initial first side shield and an initial second side shield.

According to this embodiment, it is possible to adjust the shape of the first and second side shields 50A and 50B by etching a portion of each of the initial first side shield 50AP and the initial second side shield 50BP when removing the coupling section 50CP. This serves to adjust the shape of the main pole 52. FIG. 25 is a cross-sectional view showing an example of the first and second side shields 50A and 50B after the coupling section 50CP is removed. In FIG. 25, the symbol SW1 denotes the first sidewall of the first side shield 50A; the symbol SW2 denotes the second sidewall of the second side shield 50B. In FIG. 25, the initial first side shield 50AP and the initial second side shield 50BP before etching are shown by broken lines. FIG. 25 shows an example in which the magnetic layer 50P is over-etched in the step of removing the coupling section 50CP such that the etching in the region between the first side shield 50A and the second side shield 50B terminates at the second layer 52 of the leading shield 40.

In this embodiment, as shown in FIG. 25, etching a portion of each of the initial first side shield 50A and the initial second side shield 50BP allows for an increase in the angle formed by each of the first and second sidewalls SW1 and SW2 with respect to a direction perpendicular to the top surface of the substrate 10. This makes it possible to increase the angle (hereinafter referred to as the inclination angle) formed by each of the first and second side surfaces S1 and S2 of the main pole 52 with respect to the direction perpendicular to the top surface of the substrate 10. Given the same length (dimension in the X direction) of the top edge of the end face 52a of the main pole 52, an increase in the inclination angle can reduce the height (dimension in the Z direction) of the end face 52a of the main pole 52. This serves to enhance the effect of reducing the occurrence of unwanted erasure caused by a skew.

Further, as shown in FIG. 25, by etching a portion of each of the initial first side shield 50AP, the initial second side shield 50BP and the leading shield 40, the bottom of the groove formed in the leading shield 40 by the etching becomes smaller in width (dimension in the X direction) than the minimum distance between the first sidewall SW1 and the second sidewall SW2. This allows for a reduction in the length (dimension in the X direction) of the bottom edge of the end face 52a of the main pole 52.

The present invention is not limited to the foregoing embodiment, and various modifications may be made thereto. For example, as far as the requirements of the appended claims are met, the shapes and locations of the main pole 52, the write shield 110 and the gap section 120 can be freely chosen without being limited to the examples illustrated in the foregoing embodiment. For example, a portion of the gap section 120 that separates the leading shield 40 from the bottom end 52L of the main pole 52 may be constituted by three or more nonmagnetic layers including the first and second gap layers 45 and 46. Likewise, a portion of the gap section 120 that separates the trailing shield 62 from the top surface 52T of the main pole 52 may be constituted by three or more nonmagnetic layers including the third and fourth gap layers 60 and 61.

Obviously, many modifications and variations of the present invention are possible in the light of the above teachings. Thus, it is to be understood that, within the scope of the appended claims and equivalents thereof, the invention may be practiced in other than the foregoing most preferable embodiment.

What is claimed is:

1. A manufacturing method for a magnetic head, the magnetic head comprising:
    a medium facing surface configured to face a recording medium;
    a main pole for producing a write magnetic field for use to write data on the recording medium by means of a perpendicular magnetic recording system;
    a write shield formed of a magnetic material; and
    a gap section formed of a nonmagnetic material and separating the write shield from the main pole, wherein
    the main pole has: an end face located in the medium facing surface; a top surface located at a front-side end of the main pole in a direction of travel of the recording medium; and a bottom end opposite to the top surface,
    the write shield includes a leading shield located on a rear side in the direction of travel of the recording medium relative to the main pole, and a first side shield and a second side shield located on opposite sides of the main pole in a track width direction, the leading shield has a leading shield end face located in the medium facing surface and a top surface opposed to the bottom end of the main pole, the leading shield end face being located on the rear side in the direction of travel of the recording medium relative to the end face of the main pole, the top surface of the leading shield includes a first portion and a second portion, and a step between the first portion and the second portion, the first portion has an end located in the medium facing surface, the second portion is located farther from the medium facing surface than is the first portion, and recessed from the first portion, the gap section includes a first gap layer and a second gap layer, the first gap layer is interposed between the second portion and the second gap layer, and the second gap layer has a front end located in the medium facing surface, separates the main pole from the leading shield, the first and second side shields and the first gap layer, and the second gap layer is interposed between the first portion of the top surface of the leading shield and the bottom end of the main pole, whereas the first gap layer is not interposed between the first portion of the top surface of the leading shield and the bottom end of the main pole, the manufacturing method comprising the steps of:
forming the leading shield;
forming the first gap layer on the second portion of the top surface of the leading shield after the leading shield is formed;
forming a mold after the first gap layer is formed, the mold including a first receiving section and a second receiving section for receiving the first side shield and the second side shield, the mold further including a midsection which is located between the first and second receiving sections and forms a gap between the first portion and the first gap layer;
forming a magnetic layer, the magnetic layer including an initial first side shield received in the first receiving section, an initial second side shield received in the second receiving section, and a coupling section located in the gap and coupling the initial first side shield and the initial second side shield to each other;
removing the mold after the magnetic layer is formed;
removing the coupling section after the mold is removed, by etching the magnetic layer so that the initial first side shield becomes the first side shield and the initial second side shield becomes the second side shield;
forming the second gap layer after the coupling section is removed; and
forming the main pole after the second gap layer is formed.

2. The manufacturing method for the magnetic head according to claim 1, wherein the step of forming the mold includes the steps of:
forming a first resist layer in regions where the first initial side shield and the second initial side shield are to be located later;
forming a separating film to cover the first resist layer;
forming a second resist layer on the separating film, the second resist layer being intended to become the mold later; and
removing the first resist layer and at least part of the separating film so that the second resist layer remains and becomes the mold.

3. The manufacturing method for the magnetic head according to claim 1, wherein the step of forming the leading shield includes the steps of:
forming an initial leading shield having a top surface, the top surface including a first region to become the first portion and a second region to be etched later to form the second portion; and
etching the second region of the top surface of the initial leading shield so that the first region becomes the first portion and the second portion is formed by the etching of the second region to thereby make the initial leading shield into the leading shield.

4. The manufacturing method for the magnetic head according to claim 1, wherein
the top surface of the leading shield has a first end located in the medium facing surface and a second end opposite to the first end, and
the top surface of the leading shield is inclined with respect to the medium facing surface and a direction perpendicular to the medium facing surface such that the second end is located on the rear side in the direction of travel of the recording medium relative to the first end.

5. The manufacturing method for the magnetic head according to claim 1, wherein
the write shield further includes a trailing shield located on a front side in the direction of travel of the recording medium relative to the main pole, and
the gap section further includes a third gap layer for separating the trailing shield from the top surface of the main pole,
the manufacturing method further comprising the steps of:
forming the third gap layer after the main pole is formed; and
forming the trailing shield after the third gap layer is formed.

* * * * *